US012811295B2

(12) United States Patent
Yu et al.

(10) Patent No.: US 12,811,295 B2
(45) Date of Patent: Nov. 24, 2026

(54) ELECTRONIC DEVICE

(71) Applicant: Advanced Semiconductor Engineering, Inc., Kaohsiung (TW)

(72) Inventors: Yuanhao Yu, Taoyuan (TW); Tsung-Wei Lu, Taoyuan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 36 days.

(21) Appl. No.: 18/906,114

(22) Filed: Oct. 3, 2024

(65) Prior Publication Data

US 2026/0100508 A1 Apr. 9, 2026

(51) Int. Cl.

*H01Q 1/22* (2006.01)
*H01Q 5/335* (2015.01)
*H01Q 13/18* (2006.01)
*H10W 44/20* (2026.01)

(52) U.S. Cl.

CPC ........... *H01Q 5/335* (2015.01); *H01Q 1/2283* (2013.01); *H01Q 13/18* (2013.01); *H10W 44/20* (2026.01); *H10W 44/234* (2026.01); *H10W 44/248* (2026.01)

(58) Field of Classification Search

CPC ...... H01Q 5/335; H01Q 1/2283; H01Q 13/18; H01Q 1/36; H01Q 5/364; H01Q 5/25; H01Q 1/38; H01Q 1/22; H01Q 1/50; H01Q 5/50; H10W 44/20; H10W 44/234; H10W 44/248; H10W 44/209

See application file for complete search history.

(56) References Cited

U.S. PATENT DOCUMENTS

| | | | |
|---|---|---|---|
| 6,798,992 | B1 | 9/2004 | Bishop et al. |
| 6,903,687 | B1 | 6/2005 | Fink et al. |
| 9,007,273 | B2 | 4/2015 | Liao et al. |
| 9,196,958 | B2 | 11/2015 | Arnold et al. |
| 9,653,415 | B2 | 5/2017 | Lee et al. |
| 10,009,107 | B2 | 6/2018 | Segura et al. |
| 10,530,038 | B2 | 1/2020 | Hsu et al. |
| 11,037,891 | B2 | 6/2021 | Lin et al. |
| 11,362,036 | B2 | 6/2022 | Liu |
| 11,860,410 | B2 | 1/2024 | Shin et al. |
| 2003/0086147 | A1 | 5/2003 | Bruns |
| 2004/0136045 | A1 | 7/2004 | Tran |
| 2005/0139940 | A1 | 6/2005 | Patel et al. |
| 2010/0302618 | A1 | 12/2010 | Patel et al. |

(Continued)

FOREIGN PATENT DOCUMENTS

| | | | |
|---|---|---|---|
| CN | 212572557 | U | 2/2021 |
| CN | 119137577 | A | 12/2024 |
| TW | I800865 | B | 5/2023 |

OTHER PUBLICATIONS

U.S. Appl. No. 18/228,616, filed Jul. 31, 2023, Yu et al.

(Continued)

*Primary Examiner* — Michael M Bouizza
(74) *Attorney, Agent, or Firm* — Foley & Lardner LLP

(57) ABSTRACT

The present disclosure provides an electronic device. The electronic device includes an electronic component and an antenna component. The antenna component is disposed over the electronic component and defines a cavity configured to accommodating a component to adjust an impedance matching between the electronic component and the antenna component.

19 Claims, 26 Drawing Sheets

(56) References Cited

U.S. PATENT DOCUMENTS

| | | | | |
|---|---|---|---|---|
| 2011/0164845 | A1 | 7/2011 | Jenkins et al. | |
| 2012/0062439 | A1* | 3/2012 | Liao | H01Q 1/2283 29/25.01 |
| 2012/0250137 | A1 | 10/2012 | Maxik et al. | |
| 2017/0181287 | A1 | 6/2017 | Jhang et al. | |
| 2020/0278532 | A1 | 9/2020 | Lee et al. | |
| 2023/0154825 | A1 | 5/2023 | Tong | |
| 2023/0216174 | A1 | 7/2023 | Yu et al. | |
| 2023/0289194 | A1 | 9/2023 | Colenbrander | |
| 2024/0329387 | A1 | 10/2024 | Lu et al. | |
| 2026/0090467 | A1 | 3/2026 | Chen et al. | |

OTHER PUBLICATIONS

U.S. Appl. No. 18/624,071, filed Apr. 1, 2024, Yu et al.
U.S. Appl. No. 18/092,145, filed Dec. 30, 2022, Lin et al.
U.S. Appl. No. 18/127,622, filed Mar. 28, 2023, Lu et al.
U.S. Appl. No. 18/893,748, filed Sep. 23, 2024, Chen et al.
U.S. Appl. No. 19/218,194, filed May 23, 2025, Chen et al.
Non-Final Office Action on U.S. Appl. No. 18/127,622 Dtd May 30, 2025.
Non-Final Office Action on U.S. Appl. No. 18/624,071 Dtd Sep. 29, 2025.
Notice of Allowance on U.S. Appl. No. 18/624,071 Dtd Mar. 31, 2026.

* cited by examiner

ELECTRONIC DEVICE

BACKGROUND

1. Technical Field

The present disclosure relates to an electronic device.

2. Description of the Related Art

Electronic devices using antennas for signal transmission (e.g., radio frequency (RF) signal) may include an antenna layer and a circuit layer electrically connected thereto. Typically, coupling members may be coupled to the feeding point and/or the grounding point of the antenna layer. However, the installation space required for these coupling members could be a bottleneck for package minimization and production efficiency. Additionally, the signal transmission through a coupling member can be unstable, potentially affecting antenna performance.

SUMMARY

In some arrangements, an electronic device includes an electronic component and an antenna component. The antenna component is disposed over the electronic component and defines a cavity configured to accommodating a component to adjust an impedance matching between the electronic component and the antenna component.

In some arrangements, an electronic device includes a carrier, an impedance matching component, and an antenna component. The impedance matching component is disposed over the carrier. The antenna component is disposed over the carrier. The antenna component defines a cavity. The antenna component includes a feeding structure extending to the cavity and electrically connected to the impedance matching component.

In some arrangements, an electronic device includes a carrier and an antenna component. The antenna component is disposed over the carrier and has a sidewall defining a cavity extending toward the carrier. The antenna component includes an antenna pattern and a feeding structure disposed within the cavity and connected to the antenna pattern. A portion of the sidewall is exposed by the feeding structure.

BRIEF DESCRIPTION OF THE DRAWINGS

Aspects of some arrangements of the present disclosure are best understood from the following detailed description when read with the accompanying figures. It should be noted that various structures may not be drawn to scale, and dimensions of the various structures may be arbitrarily increased or reduced for clarity of discussion.

DETAILED DESCRIPTION

Figure 1A:
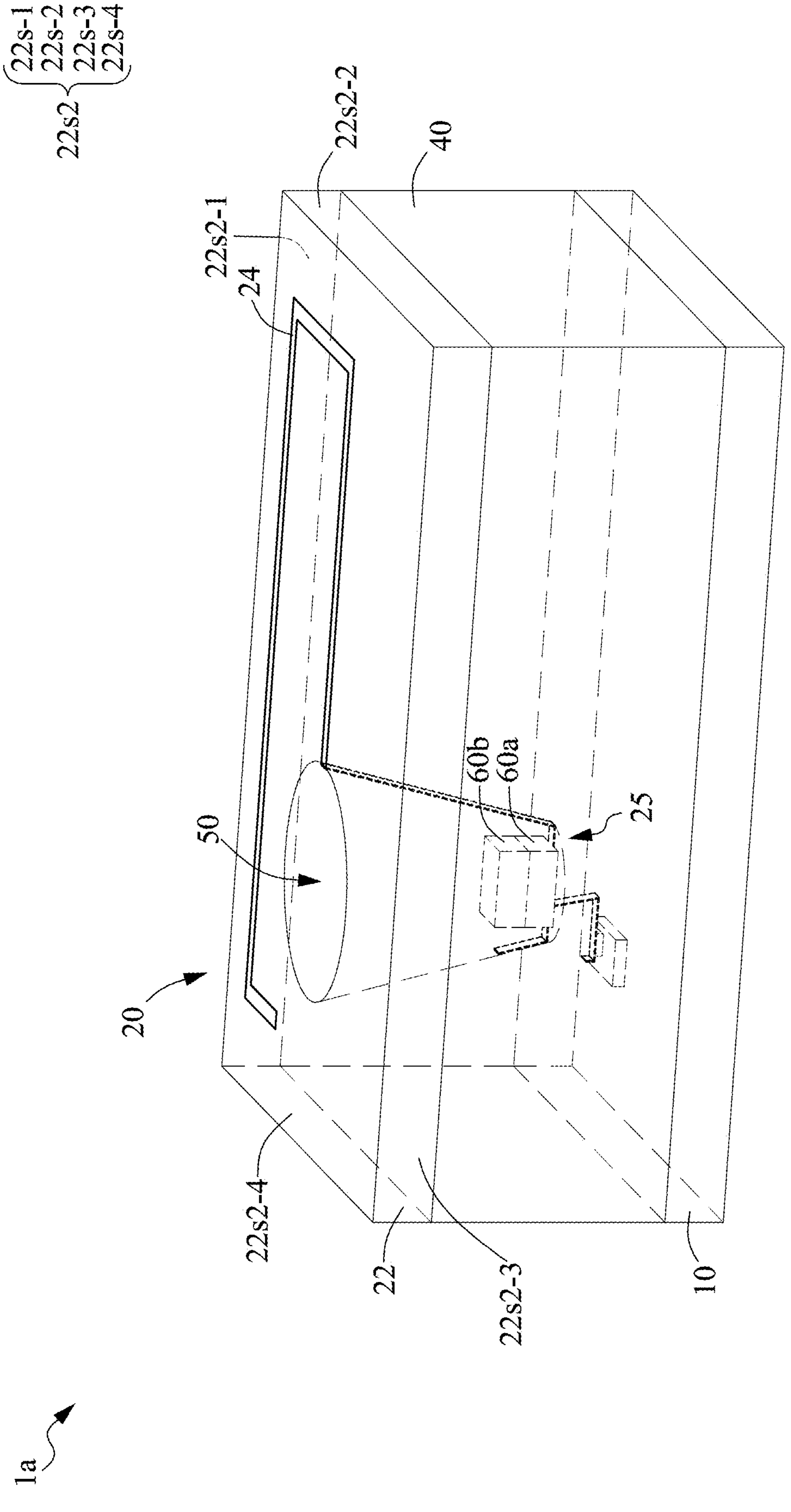
FIG. 1A illustrates a perspective view of an electronic device in accordance with some arrangements of the present disclosure.

The following disclosure provides many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact, and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

Spatial descriptions, such as “above,” “below,” “up,” “left,” “right,” “down,” “top,” “bottom,” “vertical,” “horizontal,” “side,” “higher,” “lower,” “upper,” “over,” “under,” and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of arrangements of this disclosure are not deviated from by such arrangement.

Figure 1B:
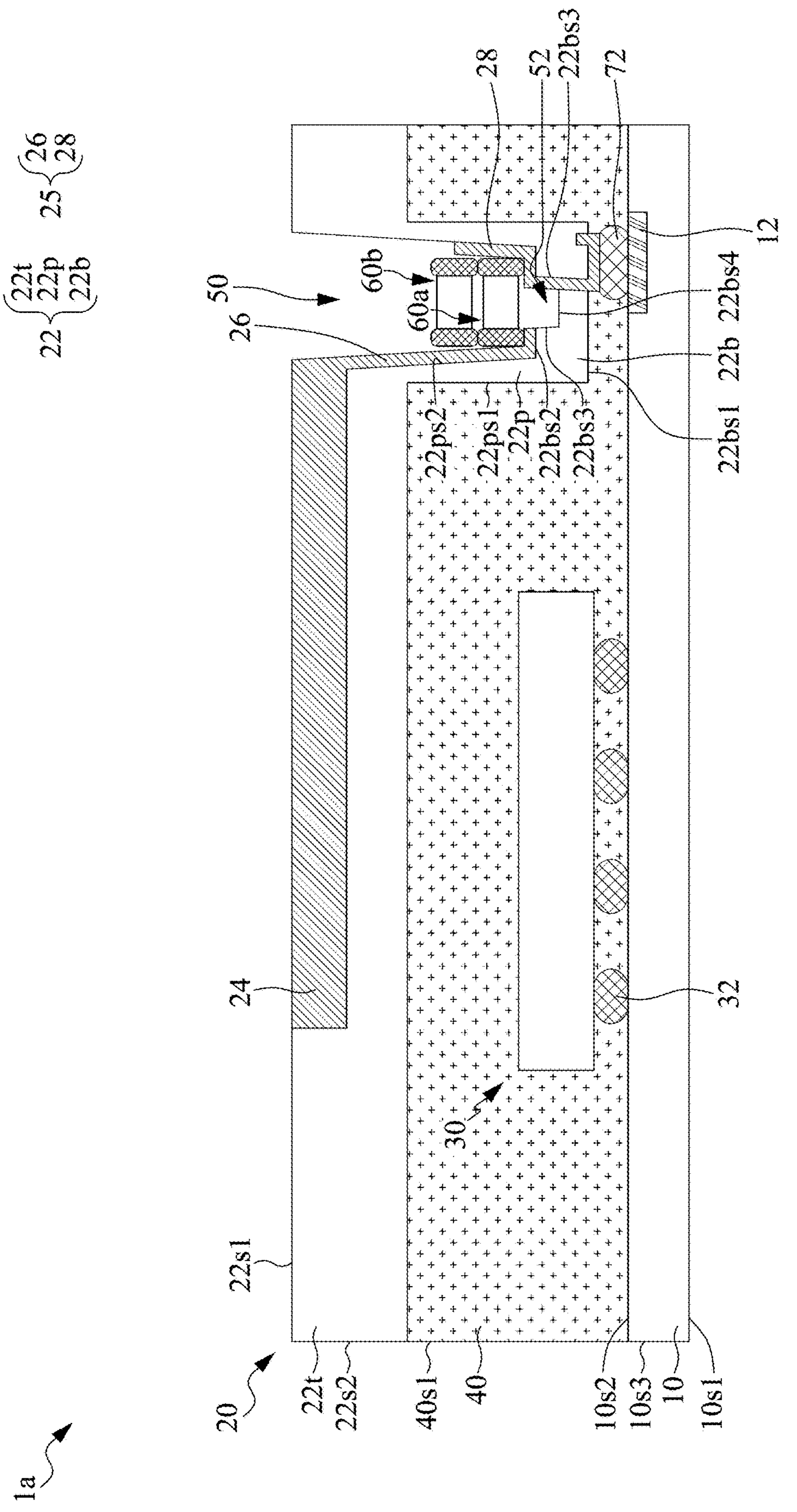
FIG. 1B illustrates a cross-sectional view of the electronic device as shown in FIG. 1B in accordance with some arrangements of the present disclosure.

FIG. 1A and FIG. 1B illustrate an electronic device 1*a* in accordance with some arrangements of the present disclosure. It should be noted than some features are omitted from FIG. 1A and FIG. 1B for brevity. In some arrangements, the electronic device 1*a* may be applicable to, for example, a wireless device, such as user equipment (UE), a mobile station, a mobile device, an apparatus communicating with the Internet of Things (IoT), etc. In some arrangements, the electronic device 1*a* may be or include a portable device. In some arrangements, the electronic device 1*a* may support fifth generation (5G) communications, such as sub-6 GHz frequency bands and/or millimeter (mm) wave frequency bands. For example, the electronic device 1*a* may incorporate both sub-6 GHz devices and mm wave devices. In some arrangements, the electronic device 1*a* may support beyond-5G or 6G communications, such as terahertz (THz) frequency. The electronic device 1*a* may be configured to radiate and/or receive electromagnetic signals, such as radio frequency (RF) signals. For example, the electronic device 1*a* may be configured to operate in a frequency between about 1 GHz and about 10 THz, such as 1 GHz, 5 GHz, 10 GHz, 20 GHz, 30 GHz, 40 GHz, 50 GHz, 100 GHz, 300 GHz, 1 THz, 5 THz, or 10 THz.

Referring to FIG. 1A, the electronic device 1*a* may include a carrier 10 and an antenna component 20. The antenna component 20 may define a cavity 50 extending toward the carrier 10. In some arrangements, the electronic device 1*a* may further include impedance matching components 60*a* and 60*b* disposed within the cavity 50. In some arrangements, the impedance matching components 60*a* and 60*b* may be configured to regulate, adjust, modify, or control a feeding signal transmitted from the carrier 10 to the antenna component 20.

Referring to FIG. 1B, the carrier 10 may include a system board, a main board, a printed circuit board (PCB), or other suitable carriers. The carrier 10 may include a circuit structure or an interconnection structure, such as a redistribution layer (RDL), a circuit layer, a conductive trace, a conductive pad, a conductive via, etc. The carrier 10 may include a surface 10*s*1 (or a lower surface), a surface 10*s*2 (or an upper surface) opposite to the surface 10*s*1, and a surface 10*s*3 (or a lateral surface) extending between the surface 10*s*1 and surface 10*s*2. The carrier 10 may include a pad 12 exposed by the surface 10*s*2. The pad 12 may be configured to, for example, provide the antenna component 20 with a feeding signal.

The antenna component 20 may be disposed on or over the surface 10*s*2 of the carrier 10. The antenna component 20 may be configured to radiate and/or receive electromagnetic (EM) signals, such as RF signals. In some arrangements, the antenna component 20 may include an antenna in package (AiP) device. The antenna component 20 may be of any suitable type, such as patch antennas, slot-coupled antennas, stacked patches, dipoles, monopoles, etc., and may have different orientations and/or polarizations. The antenna component 20 may include an ultra-wideband antenna. In simulated results of reflection coefficient versus frequency of the antenna component 20, the range/band of frequencies less than 10% of the fed signal (i.e., 10 dB) is between approximately 5.8 GHz and 8.5 GHz, such as 5.8 GHz, 6.2 GHz, 6.6 GHz, 7 GHz, 7.5 GHz, 8 GHz, or 8.5 GHz. In some arrangements, the antenna component 20 may be pre-formed by a laser direct structuring (LDS) process.

In some arrangements, the antenna component 20 may include a dielectric structure 22, an antenna pattern 24, and a feeding structure 25 (or conductive structure or feeding element). The dielectric structure 22 may be configured to support the antenna pattern 24 and/or feeding structure 25. The dielectric structure 22 may be disposed on and/or attached to the surface 10*s*2 of the carrier 10. In some arrangements, the dielectric structure 22 may include a compound, such as a liquid crystal compound. For example, the dielectric structure 22 may include a compound having a liquid crystal base, such as a liquid crystal polymer (LCP). The dielectric structure 22 may withstand temperatures up to 260 degrees Celsius or higher. The dielectric structure 22 may have a dielectric constant (Dk) between about 2 and 6. The dielectric structure 22 may have a dissipation factor (Df) between about 0 and 0.009. In some arrangements, the dielectric structure 22 may include an epoxy resin, a thermoplastic polyurethane (TPU), soda-lime-silica glass, alkali-aluminosilicate glass, liquid silicone rubber (LSR), polycarbonate (PC), nylon, polybutylene terephthalate (PBT), etc. The dielectric structure 22 may have a surface 22*s*1 (or an upper surface), and a surface 22*s*2 (or a lateral surface) substantially perpendicular to the surface 22*s*1.

In some arrangements, the dielectric structure 22 may have an upper portion 22*t*, a lower portion 22*b* (or a base portion), and an extension portion 22*p* (or a middle portion) between the upper portion 22*t* and the lower portion 22*b*. The upper portion 22*t* may be a plate spaced apart from the carrier 10. In some arrangements, the upper portion 22*t* may support and expose the antenna pattern 24.

The extension portion 22*p* may extend between the upper portion 22*t* and the lower portion 22*b*. In some arrangements, the extension portion 22*p* may support the upper portion 22*t*. In some arrangements, the extension portion 22*p* may be configured to support the feeding structure 25. In some arrangements, the extension portion 22*p* may have a sidewall 22*ps*1 (or an outer sidewall) and a sidewall 22*ps*2 (or an inner sidewall). In some arrangements, the sidewall 22*ps*2 may define a cavity 50 (or recess, opening, or through hole) extending between the lower portion 22*b* and the surface 22*s*1 of the dielectric structure 22. In some arrangements, the slope defined by the sidewall 22*ps*1 and the normal direction of the surface 10*s*2 may be different from the slope defined by the sidewall 22*ps*2 and the normal direction of the surface 10*s*2. In some arrangements, the sidewall 22*ps*1 may be steeper than the sidewall 22*ps*2. In some arrangements, the extension portion 22*p* may be tapered along a direction far away from the carrier 10.

In some arrangements, the lower portion 22*b* may serve as the bottom the cavity 50. In some arrangements, the lower portion 22*b* may have a surface 22*bs*1 and a surface 22*bs*2. In some arrangements, the surface 22*bs*1 may be spaced apart from the carrier 10. The surface 22*bs*1 may serve as the bottommost layer of the dielectric structure 22. The surface 22*bs*2 may serve as the bottom of the cavity 50. The surface 22*bs*2 may be configured to support the feeding structure 25. In some arrangements, the lower portion 22*b* may include a surface 22*bs*3 and a surface 22*bs*4. The surface 22*bs*3 may extend between the surface 22*bs*2 and the surface 22*bs*4. The surface 22*bs*3 and surface 22*bs*4 may define a recess 52. In some arrangements, the recess 52 may be in communication with the cavity 50. In some arrangements, the recess 52 may have an aperture smaller than that of the cavity 50.

In some arrangements, the antenna pattern 24 may be disposed adjacent to the surface 22*s*1 of the dielectric structure 22. In some arrangements, the antenna pattern 24 may be exposed by the surface 22*s*1 of the dielectric structure 22. Although FIG. 1B illustrates that the antenna pattern 24 is embedded within the dielectric structure 22, it should be noted that the antenna pattern 24 may protrude from the surface 22*s*1 in other arrangements. The antenna pattern 24 may be configured to receive and/or transmit an RF signal from and/or toward the environment. Further, the profile of the antenna pattern 24 as shown in FIG. 1A is merely exemplary; the antenna pattern 24 may include other shapes, such as a circle, an oval, a triangle, a quadrangle, a polygon, or a combination thereof. Refer back to FIG. 1A, the edge of the antenna pattern 24 may be substantially parallel to the surface 22*s*2 of the dielectric structure 22. For example, the dielectric structure 22 may include surfaces 22*s*2-1, 22*s*2-2, 22*s*2-3, and 22*s*2-4. The edge of the antenna pattern 24 may be substantially parallel to the surfaces 22*s*2-1, 22*s*2-2, 22*s*2-3, and 22*s*2-4.

In some arrangements, the feeding structure 25 may extend between the antenna pattern 24 and the lower portion 22*b*. The feeding structure 25 may be configured to receive and/or transmit a feeding signal. In some arrangements, the feeding structure 25 may extend from the surface 22*s*1 of the dielectric structure 22 toward the carrier 10. In some arrangements, the feeding structure 25 may be electrically connected to the antenna pattern 24. In some arrangements, the feeding structure 25 may be electrically connected to the pad 12 of the carrier 10. In some arrangements, the feeding structure 25 may include a conductive layer 26 and a conductive layer 28.

In some arrangements, the conductive layer 26 may be connected to one of the terminals (e.g., first terminal) of the impedance matching component 60*a* and/or 60*b*. In some arrangements, the conductive layer 26 may be disposed within the cavity 50. In some arrangements, the conductive layer 26 may be disposed on or over the extension portion 22*p*. In some arrangements, the conductive layer 26 may be disposed on or over the sidewall 22*ps*2. In some arrangements, the conductive layer 26 may be disposed on or over the extension portion 22*p*. In some arrangements, a portion of the conductive layer 26 may be disposed on or over the surface 22*bs*2 of the lower portion 22*b*. In some arrangements, a portion of the conductive layer 26 (e.g., upper portion of the conductive layer 26) may be free from laterally overlapping the conductive layer 28.

In some arrangements, the conductive layer 28 may be spaced apart from the conductive layer 26. In some arrangements, the conductive layer 28 may be connected to the other one of the terminals (e.g., second terminal) of the impedance matching component 60*a* and/or 60*b*. In some arrangements, the conductive layer 28 may be disposed within the cavity 50. In some arrangements, the conductive layer 28 may be disposed on or over the extension portion 22*p*. In some arrangements, the conductive layer 28 may be disposed on or over the sidewall 22*ps*2 of the extension portion 22*p*. In some arrangements, a portion of the conductive layer 28 may be disposed on or over the surface 22*bs*2 of the lower portion 22*b*. In some arrangements, the conductive layer 28 may be disposed on or over the surface 22*bs*3. In some arrangements, the conductive layer 28 may be disposed on or over the surface 22*bs*4. In some arrangements, the conductive layer 28 may penetrate the lower portion 22*b*. In some arrangements, a portion of the conductive layer 28 may be exposed by the surface 22*bs*1 of the lower portion 22*b*. In some arrangements, a portion of the conductive layer 28 (e.g., lower portion of the conductive layer 28) may be free from laterally overlapping the conductive layer 26. In some arrangements, a portion of the sidewall 22*ps*2 may be exposed by the feeding structure 25.

In some arrangements, the electronic component 30 may be disposed on or over the surface 10*s*2 of the carrier 10. In some arrangements, the electronic component 30 may be configured to control the antenna elements. For example, the electronic component 30 may be configured to control the feeding start and end times, the feeding duration, the number of feed points, the location of feed points, the RF impedance matching, the transmitting start and end times, the receiving start and end times, the grounding start and end times, the grounding duration, the number of ground points, the location of ground points, the frequencies (or operating frequencies), the bandwidths (or operating bandwidths), the wavelengths of the EM waves, etc.

The electronic component 30 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof. In some arrangements, the electronic component 30 may include a transmitter, a receiver, or a transceiver. In some arrangements, the electronic component 30 may include a processing unit and/or a controller. In some arrangements, the electronic component 30 may include a radio frequency IC (RFIC), an analog-to-digital (A/D) converter, a digital-to-analog (D/A) converter, a filter, a low noise amplifier (LNA), a power amplifier, a multiplexer, a demultiplexer, a modulator, and/or a demodulator, etc. Although FIG. 1B illustrates that the electronic device 1*a* includes one electronic component 30, it should be noted that the electronic device 1*a* may include more electronic components based on the requirements. Further, the electronic component 30 may be electrically connected to the carrier 10 by electrical connectors 32. In some arrangements, the electrical connector 32 may include a reflowable material or a solder material, such as tin (Sn), gallium (Ga), indium (In), bismuth (Bi), or other suitable materials. In other arrangements, the electronic component 30 may be electrically connected to the carrier 10 by a conductive wire (or bonding wire) or other suitable elements.

In some arrangements, the encapsulant 40 may be disposed on or over the surface 10*s*2 of the carrier 10. In some arrangements, the encapsulant 40 may be disposed between the carrier 10 and the dielectric structure 22. The encapsulant 40 may encapsulate the electronic component 30. In some arrangements, the encapsulant 40 may encapsulate and/or surround the extension portion 22*p* of the dielectric structure 22. In some arrangements, the encapsulant 40 may be in contact with the sidewall 22*ps*1. In some arrangements, the feeding structure 25 may be spaced apart from the encapsulant 40. In some arrangements, the encapsulant 40 may be made of molding material that may include, for example, a novolac-based resin, an epoxy-based resin, a silicone-based resin, or another suitable encapsulant. Suitable fillers may also be included, such as powdered $SiO_2$. In some arrangements, the encapsulant 40 may include a molding compound, which is formed by a molding technique, such as compression molding, injection molding, or transfer molding. The encapsulant 40 may have a surface 40*s*1 (or a lateral surface) exposed by the carrier 10 and the dielectric structure 22. In some arrangements, the surface 40*s*1 of the encapsulant 40 may be substantially aligned with the surface 10*s*3 of the carrier 10. In some arrangements, the surface 40*s*1 of the encapsulant 40 may be substantially aligned with the surface 22*s*2 of the dielectric structure 22. In some arrangements, the encapsulant 40 may be in contact with the surface 22*bs*1 of the dielectric structure 22. In some arrangements, the encapsulant 40 may be disposed between the carrier 10 and the antenna component 20. In some arrangements, a portion of the encapsulant 40 may be disposed between the carrier 10 and the lower portion 22*b* of the dielectric structure 22.

In some arrangements, the cavity 50 may extend from the surface 22*s*1 toward the carrier 10. In some arrangements, the cavity 50 may be configured to accommodate the feeding structure 25. The cavity 50 may penetrate a portion of the dielectric structure 22 of the antenna component 20. In some arrangements, the cavity 50 may be configured to accommodate the conductive layer 26. In some arrangements, the cavity 50 may be configured to accommodate the conductive layer 28. In some arrangements, the cavity 50 may be configured to accommodate the impedance matching component 60*a* and/or 60*b*. In some arrangements, the aperture of the cavity 50 may be tapered toward the carrier 10. In some arrangements, the cavity 50 may have a circular shaped profile as shown in FIG. 1A.

In some arrangements, the impedance matching components 60*a* and 60*b* (or components) may be disposed within the cavity 50. In some arrangements, the impedance matching components 60*a* and 60*b* may be stacked. In some arrangements, the impedance matching component 60*a* and/or 60*b* may be exposed by the antenna component 20. In some arrangements, the impedance matching component 60*a* and/or 60*b* may be exposed by the cavity 50. In some arrangements, the impedance matching components 60*a* and 60*b* may be exposed to air. In some arrangements, the impedance matching component 60*a* may be disposed on or over the lower portion 22*b* of the dielectric structure. In some arrangements, the impedance matching component 60*a* may be disposed on or over the surface 22*bs*2. In some arrangements, the impedance matching components 60*a* and 60*b* may be detachable. In some arrangements, the impedance matching component 60*a* and/or 60*b* may have a first terminal connected to the conductive layer 26 and a second terminal connected to the conductive layer 28. In some arrangements, the impedance matching component 60*a* and/or 60*b* may be electrically connected to the electronic component 30.

In some arrangements, the impedance matching components 60*a* and 60*b* may be adjust the impedance matching between the electronic component 30 and the antenna component 20. In some arrangements, the impedance matching components 60*a* and 60*b* may be configured to modulate, adjust, control, and/or modify a feeding signal, which thereby improves the performance of the antenna component 20. In some arrangements, each of the impedance matching components 60*a* and 60*b* may include a passive component, such as an inductor, capacitor, or other suitable components. It should be noted that although FIG. 1A and FIG. 1B illustrate that the electronic device 1*a* includes two impedance matching components, the electronic device 1*a* may include one or any quantity of the impedance matching components. In some arrangements, the impedance matching components 60*a* and 60*b* may be regarded as a part of the feeding structure 25. In some arrangements, the impedance matching component 60*a* may be electrically coupled to the impedance matching component 60*b* through a reflowable material, such as a solder material.

In some arrangements, the electronic device 1*a* may include an electrical connector 72 (or a conductive element). In some arrangements, the electrical connector 72 may be disposed on or over the surface 10*s*2 of the carrier 10. In some arrangements, the electrical connector 72 may be connected to the surface 22*bs*1 of the dielectric structure 22. The electrical connector 72 may be electrically connected to the carrier 10 through the pad 12. The electrical connector 72 may be configured to transceive an RF signal between the carrier 10 and the feeding structure 25. In some arrangements, the electrical connector 72 may be electrically connected to the feeding structure 25. In some arrangements, a feeding signal may be transmitted from the carrier 10 to the feeding structure 25 through the electrical connector 72. In some arrangements, the electrical connector 72 may be encapsulated by the encapsulant 40. The electrical connector 72 may include a metallic material different from that of the feeding structure 25. In some arrangements, the electrical connector 72 may include a reflowable material or a solder material, such as tin (Sn), gallium (Ga), indium (In), bismuth (Bi), or other suitable materials. The reflowable temperature of the electrical connector 72 may be about 260 degrees Celsius or higher.

In this arrangement, the electrical properties (e.g., the bandwidth, antenna gain, or the like) may be regulated, adjusted, modified, and/or controlled by the impedance matching components 60*a* and 60*b*. As a result, the electrical properties may be finely tuned and reversible, which thereby improves and customizes the electrical properties (e.g., the bandwidth, antenna gain, or the like) of the electronic device 1*a*. In this arrangement, the profile and the location of the antenna pattern 24 and feeding structure 25 are predetermined and integrated within one dielectric structure 22. When an antenna integrated structure, which includes a plurality of antenna components, is attached to the carrier 10, each feeding structure 25 may be aligned with a corresponding electrical connector 72 with less offset. In a comparative example, individual antenna units may be attached to a carrier using solder material, followed by a reflow technique to cure the solder. In this scenario, the antenna units may experience significant displacement and rotation offsets due to process issues.

Figure 2A:
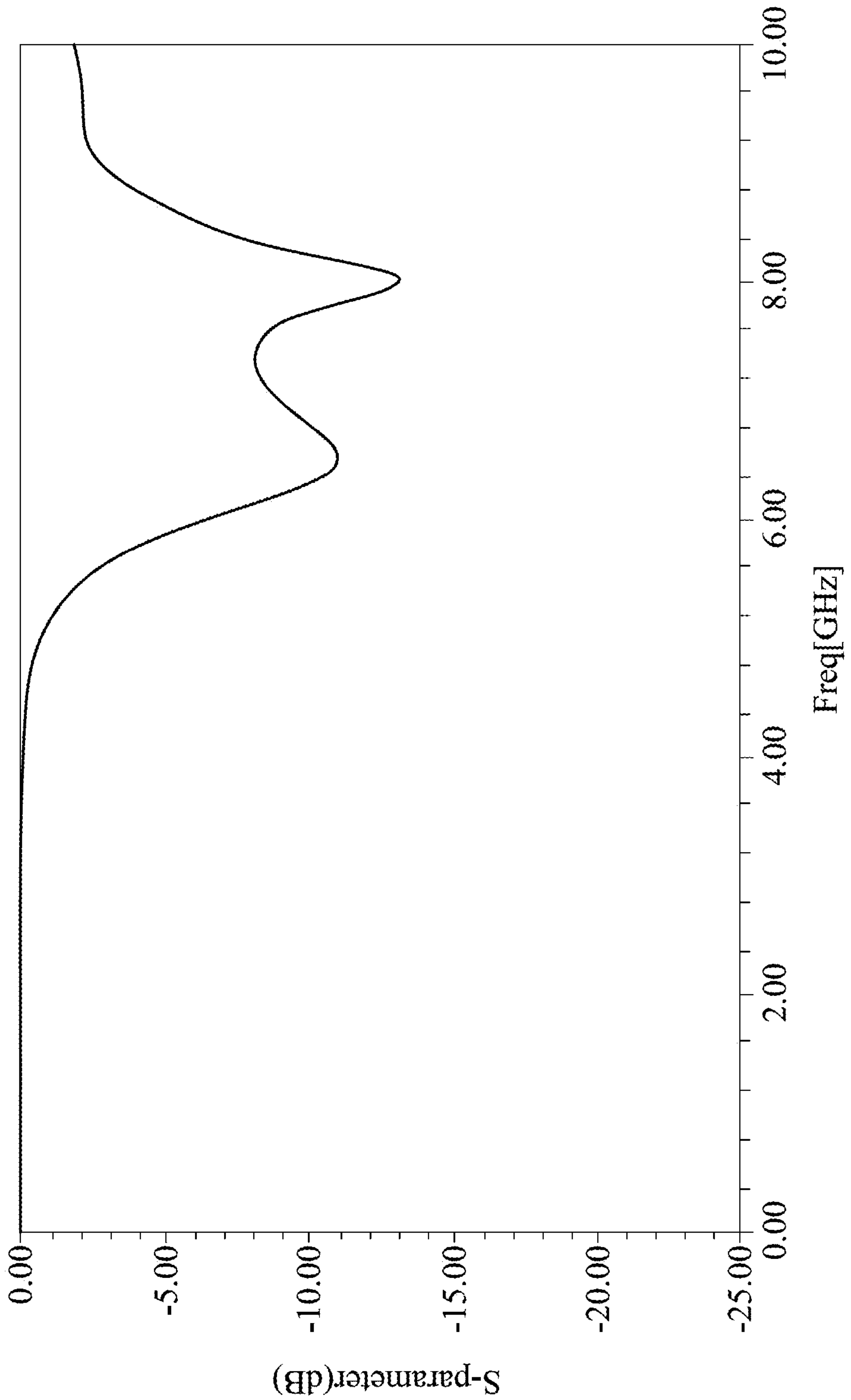
FIG. 2A illustrates a simulated result of the S-parameter versus frequency of a comparative electronic devices.
Figure 2B:
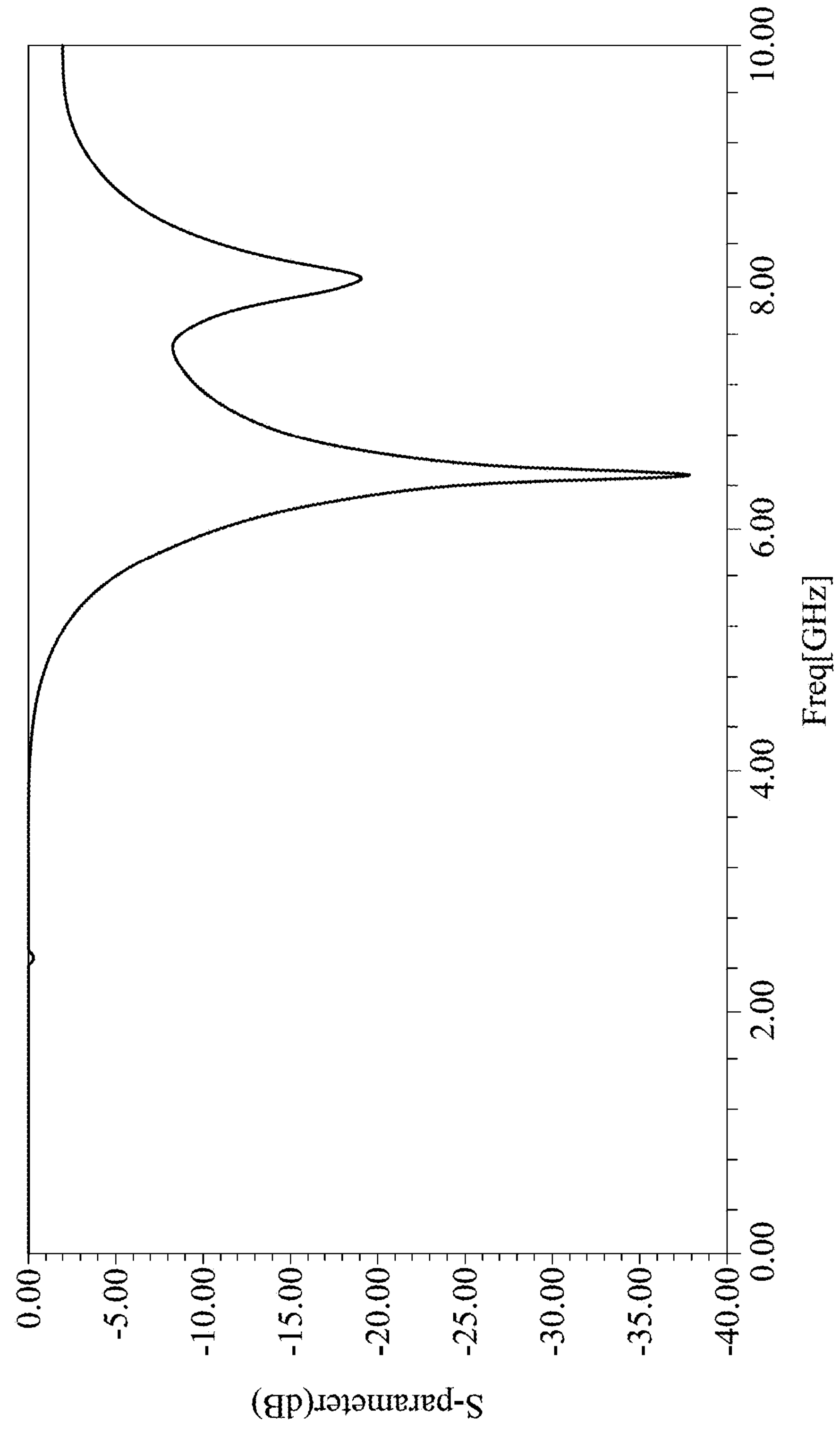
FIG. 2B illustrates a simulated result of the S-parameter versus frequency of the electronic devices of the present disclosure.

FIG. 2A illustrates simulated results of the S-parameter (or reflection coefficient) versus frequency of a comparative electronic device, and FIG. 2B illustrates simulated results of the S-parameter versus frequency of an electronic device of the present disclosure. More specifically, the structural difference between the comparative example and the electronic device of the present disclosure is that the electronic device of the present disclosure further includes an impedance matching component(s).

The value of the X-axis may indicate a frequency. The unit of the X-axis is $10^9$ Hz (GHz). The unit of the Y-axis is decibels (dBs). As shown in FIGS. 2A and 2B, the curve may have the first peak at the frequency of 6.5 GHZ and the second peak at the frequency of about 8 GHZ. After the impedance matching component(s) is used, the S-parameter of the first peak is improved from about −11 dB to about −38 dB, and the S-parameter of the second peak is improved from −13 dB to about −19 dB. As a result, the antenna gain of the first peak is improved up to 3.21 dBi, and the antenna gain of the second peak is improved up to 5.05 dBi.

Figure 3:
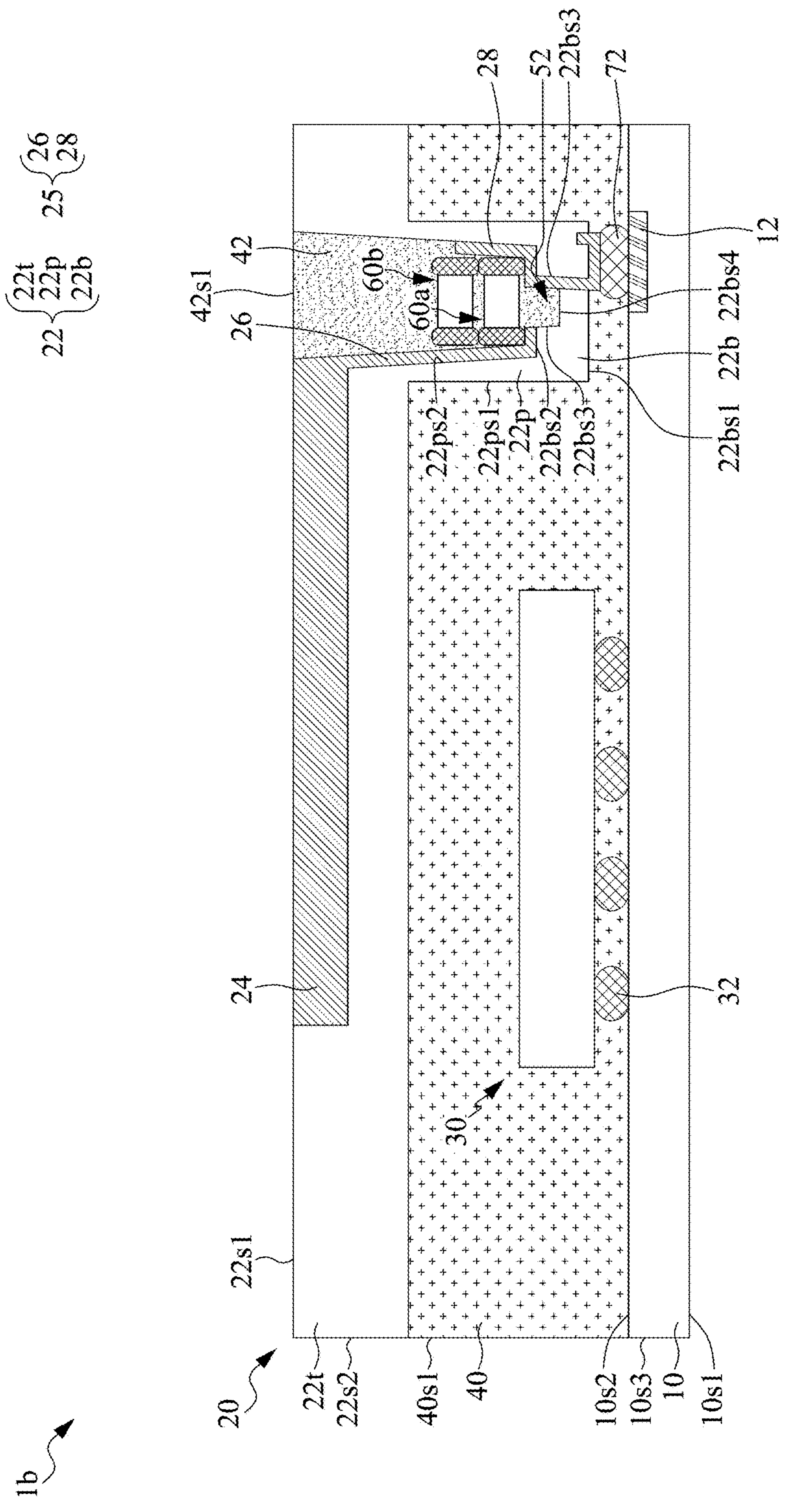
FIG. 3 illustrates a cross-sectional view of the electronic device in accordance with some arrangements of the present disclosure.

FIG. 3 illustrates a cross-sectional view of the electronic device 1*b* in accordance with some arrangements of the present disclosure. The electronic device 1*b* of FIG. 3 is similar to the electronic device 1*a*, differing as follows.

In some arrangements, the electronic device 1*b* may include an encapsulant 42 (or a protection layer). In some arrangements, the encapsulant 42 may be disposed within the cavity 50. In some arrangements, the encapsulant 42 may cover the lower portion 22*b* of the dielectric structure 22. In some arrangements, the encapsulant 42 may cover the impedance matching components 60*a* and 60*b*. In some arrangements, the encapsulant 42 may cover the conductive layer 26. In some arrangements, the encapsulant 42 may cover the conductive layer 28. In some arrangements, the antenna pattern 24 may be exposed by the encapsulant 42. In some arrangements, the encapsulant 42 may be made of molding material that may include, for example, a novolac-based resin, an epoxy-based resin, a silicone-based resin, or another suitable encapsulant. Suitable fillers may also be included, such as powdered $SiO_2$. In some arrangements, the encapsulant 42 may include a molding compound, which is formed by a molding technique, such as compression molding, injection molding, or transfer molding. In some arrangements, the encapsulant 42 may be tapered toward the carrier 10. In some arrangements, the encapsulant 42 may be in contact with a portion of the sidewall 22*ps*2. The encapsulant 42 may have a surface 42*s*1 (or an upper surface). In some arrangements, the surface 42*s*1 may be substantially aligned with the surface 22*s*1 of the dielectric structure 22. The encapsulant 42 may be configured to protect the feeding structure 25, impedance matching component 60*a*, and/or 60*b* from damage or moisture from the environment.

Figure 4:
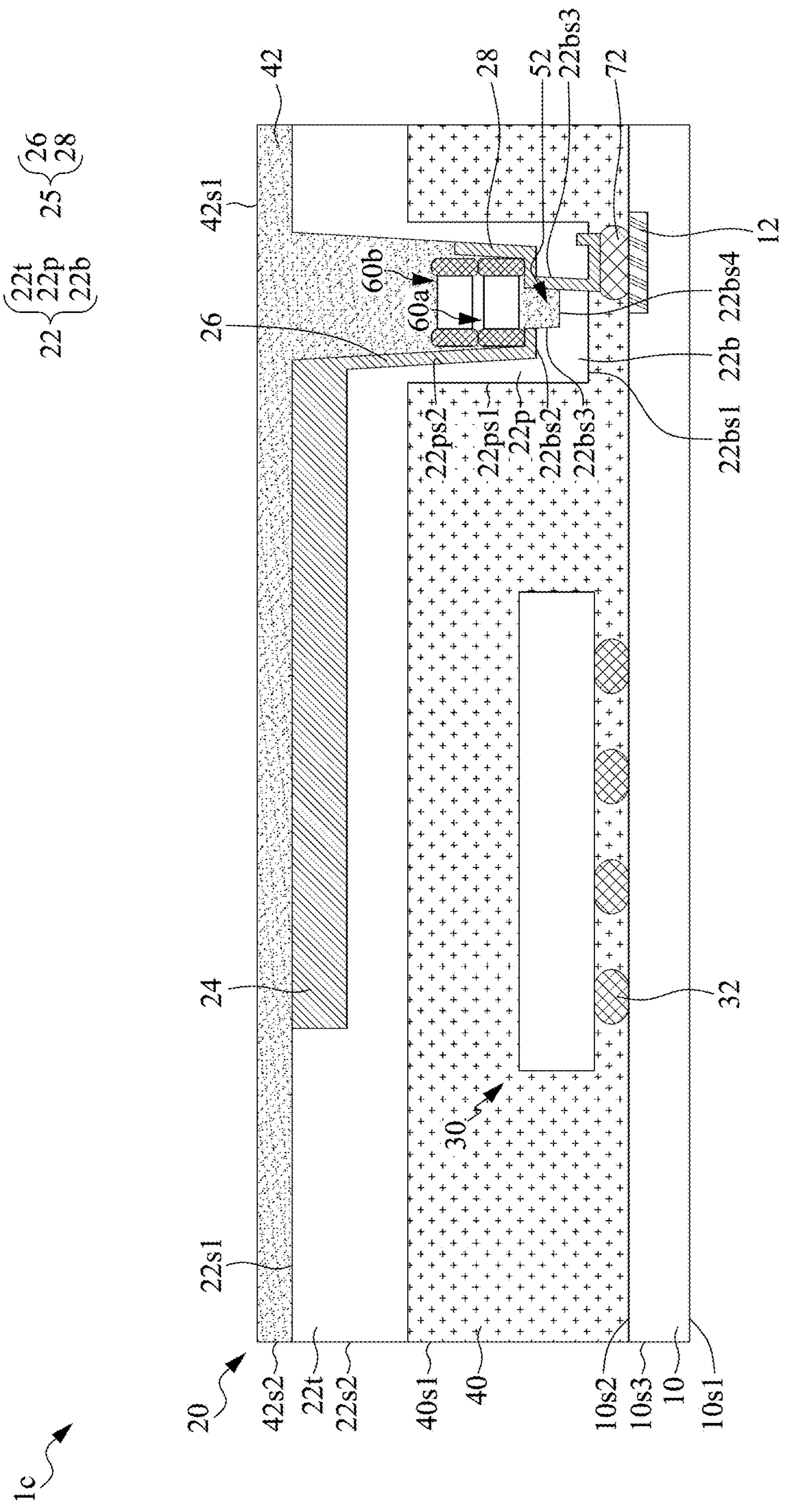
FIG. 4 illustrates a cross-sectional view of the electronic device in accordance with some arrangements of the present disclosure.

FIG. 4 illustrates a cross-sectional view of the electronic device 1*c* in accordance with some arrangements of the present disclosure. The electronic device 1*c* of FIG. 4 is similar to the electronic device 1*a*, differing as follows.

In some arrangements, the encapsulant 42 may cover the surface 22*s*1 of the dielectric structure 22. In some arrangements, the encapsulant 42 may cover the dielectric structure 22. In some arrangements, the encapsulant 42 may cover the antenna pattern 24. The encapsulant 42 may have a surface 42*s*2 (or a lateral surface) connected to the surface 42*s*1. In some arrangements, the surface 42*s*2 may be substantially aligned with the surface 22*s*2 of the dielectric structure 22.

Figure 5:
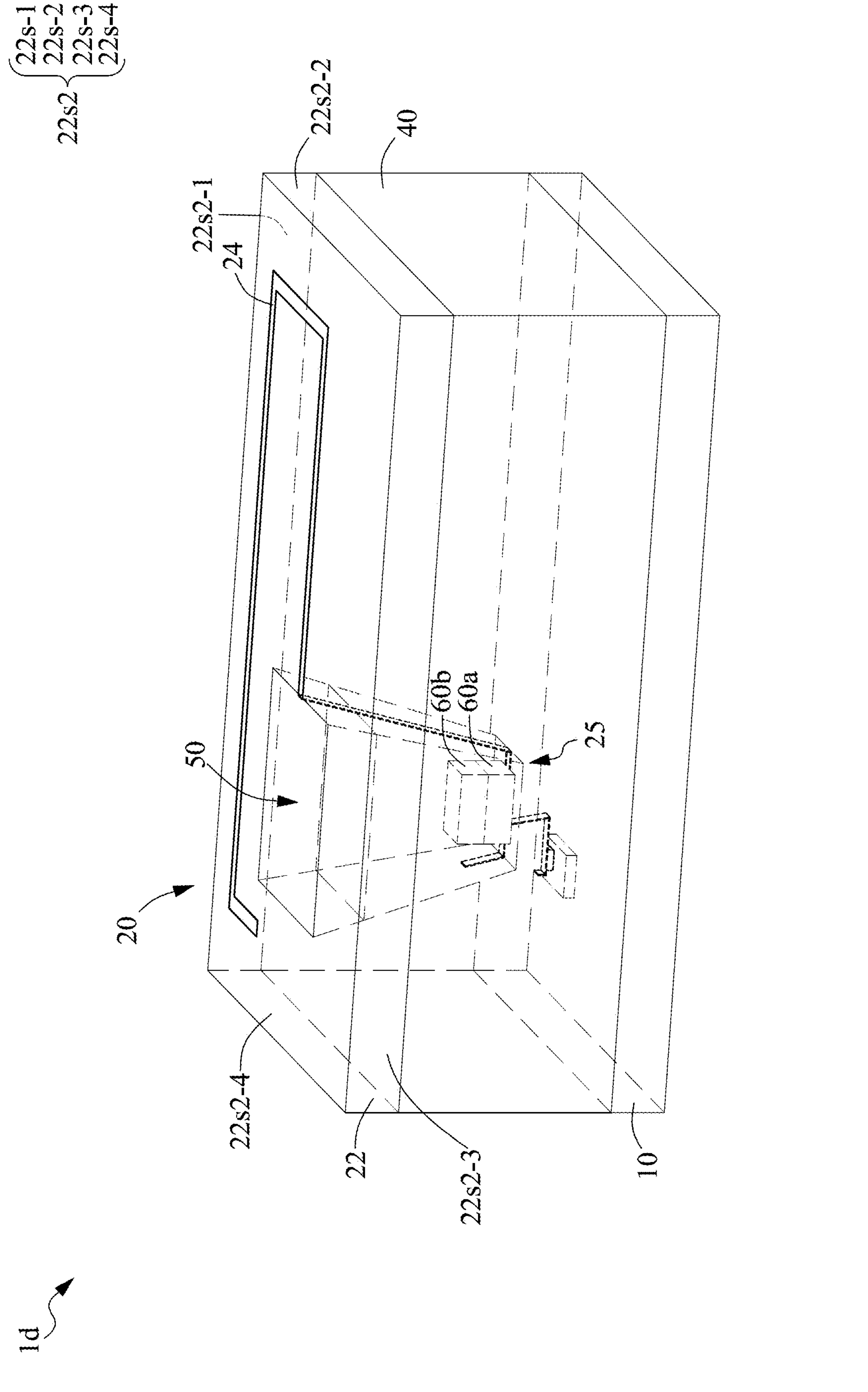
FIG. 5 illustrates a perspective view of an electronic device in accordance with some arrangements of the present disclosure.

FIG. 5 illustrates a perspective view of an electronic device 1*d* in accordance with some arrangements of the present disclosure. The electronic device 1*d* of FIG. 5 is similar to the electronic device 1*a*, differing as follows.

In some arrangements, the cavity 50 may have a rectangular profile. The dielectric structure 22 may have four lateral surfaces (or inner sidewall) defining the cavity 50. In other arrangements, the cavity 50 may have other suitable profiles, such as an oval, a triangle, a quadrangle, or a polygon.

Figure 6:
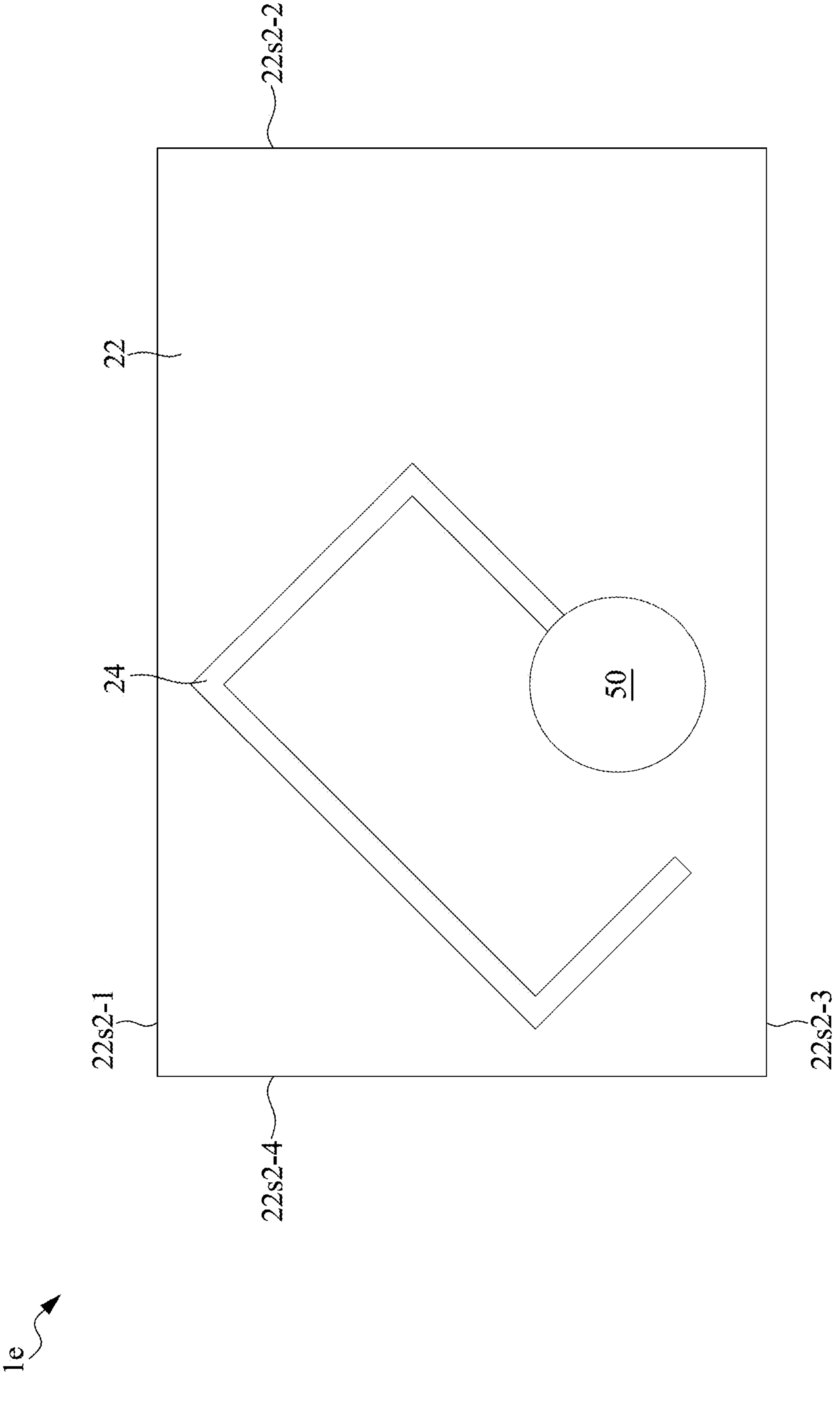
FIG. 6 illustrates a top view of an electronic device in accordance with some arrangements of the present disclosure.

FIG. 6 illustrates a top view of an electronic device 1*e* in accordance with some arrangements of the present disclosure. The electronic device 1*e* of FIG. 6 is similar to the electronic device 1*a*, differing as follows.

Comparing the electronic device 1*a* and electronic device 1*e*, the electronic device 1*a* illustrates the antenna pattern 24 with no substantial offsets (e.g., displacement and/or rotation offset), and the antenna pattern 24 of the electronic device 1*e* has a rotation offset and/or displacement offset.

The dielectric structure 22 may have surfaces 22*s*2-1, 22*s*2-2, 22*s*2-3, and 22*s*2-4. In some arrangements, the profile of the antenna pattern 24 of the electronic device 1*a* may define an ideal distance between the edge of the antenna pattern 24 and surfaces 22*s*2-1, 22*s*2-2, 22*s*2-3, and 22*s*2-4. As shown in FIG. 1A, the edge of the antenna pattern 24 of the electronic device 1*a* may be substantially parallel to the surfaces 22*s*2-1, 22*s*2-2, 22*s*2-3, and/or 22*s*2-4. As shown in FIG. 6, the edge of the antenna pattern 24 of the electronic device 1*e* may be non-parallel to the surfaces 22*s*2-1, 22*s*2-2, 22*s*2-3, and/or 22*s*2-4. Such rotational offset and/or displacement offset may result in a frequency offset of signals (e.g., RF signals) between the electronic devices 1*a* and 1*e*.

FIGS. 7A to 7G illustrate various stages of an example of a method for manufacturing an electronic device according to some arrangements of the present disclosure.

Figure 7A:
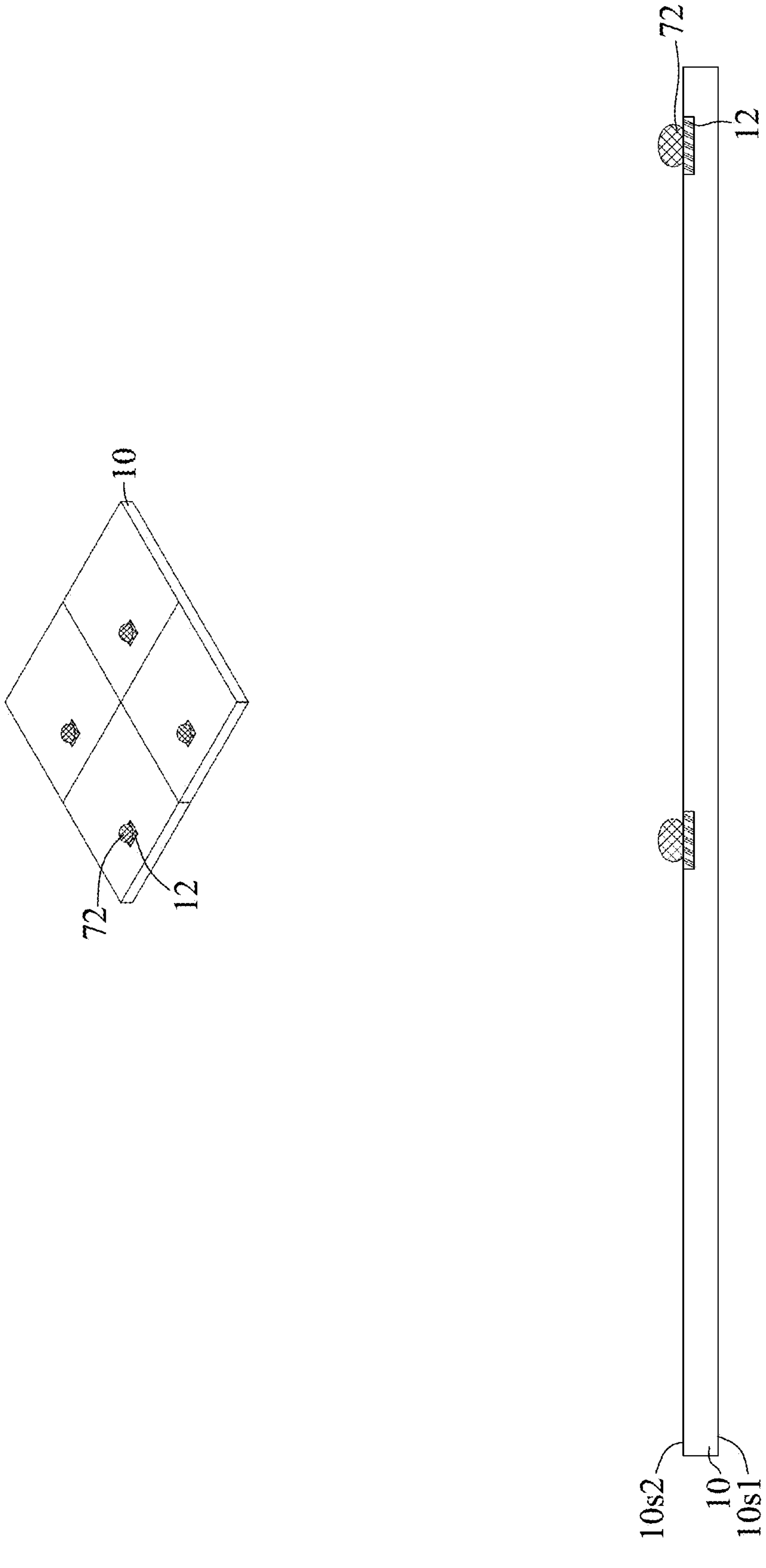
FIG. 7A illustrates one or more stages of an example of a method for manufacturing an electronic device according to some embodiments of the present disclosure.

Referring to FIG. 7A, the carrier 10 may be provided. The carrier 10 may have the pad 12 exposed by the surface 10*s*2. In some arrangements, the electrical connectors 72 may be formed on or over the pad 12. The electrical connector 72 may be formed by, for example, a printing technique, a coating technique, or other suitable techniques. In some arrangements, the carrier 10 may include a plurality of repeated units. Said repeated units may be separated after a singulation technique is performed.

Figure 7B:
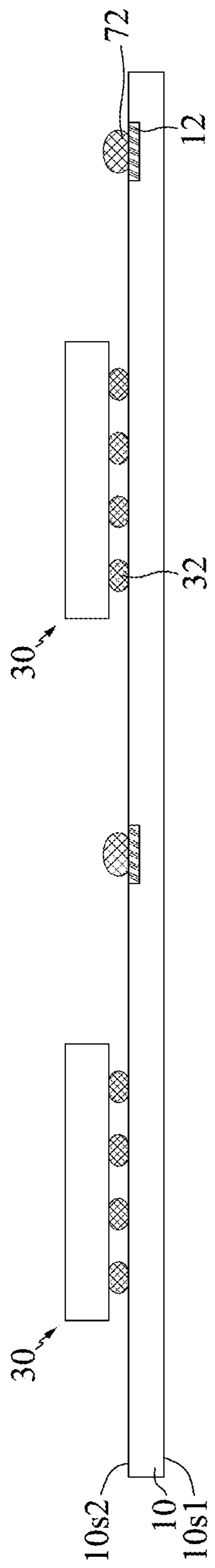
FIG. 7B illustrates one or more stages of an example of a method for manufacturing an electronic device according to some embodiments of the present disclosure.

Referring to FIG. 7B, the electronic components 30 may be attached to the surface 10*s*2 of the carrier 10. In some arrangements, the electronic component 30 may be attached to the carrier 10 by a surface mount technique or other suitable techniques.

Figure 7C:
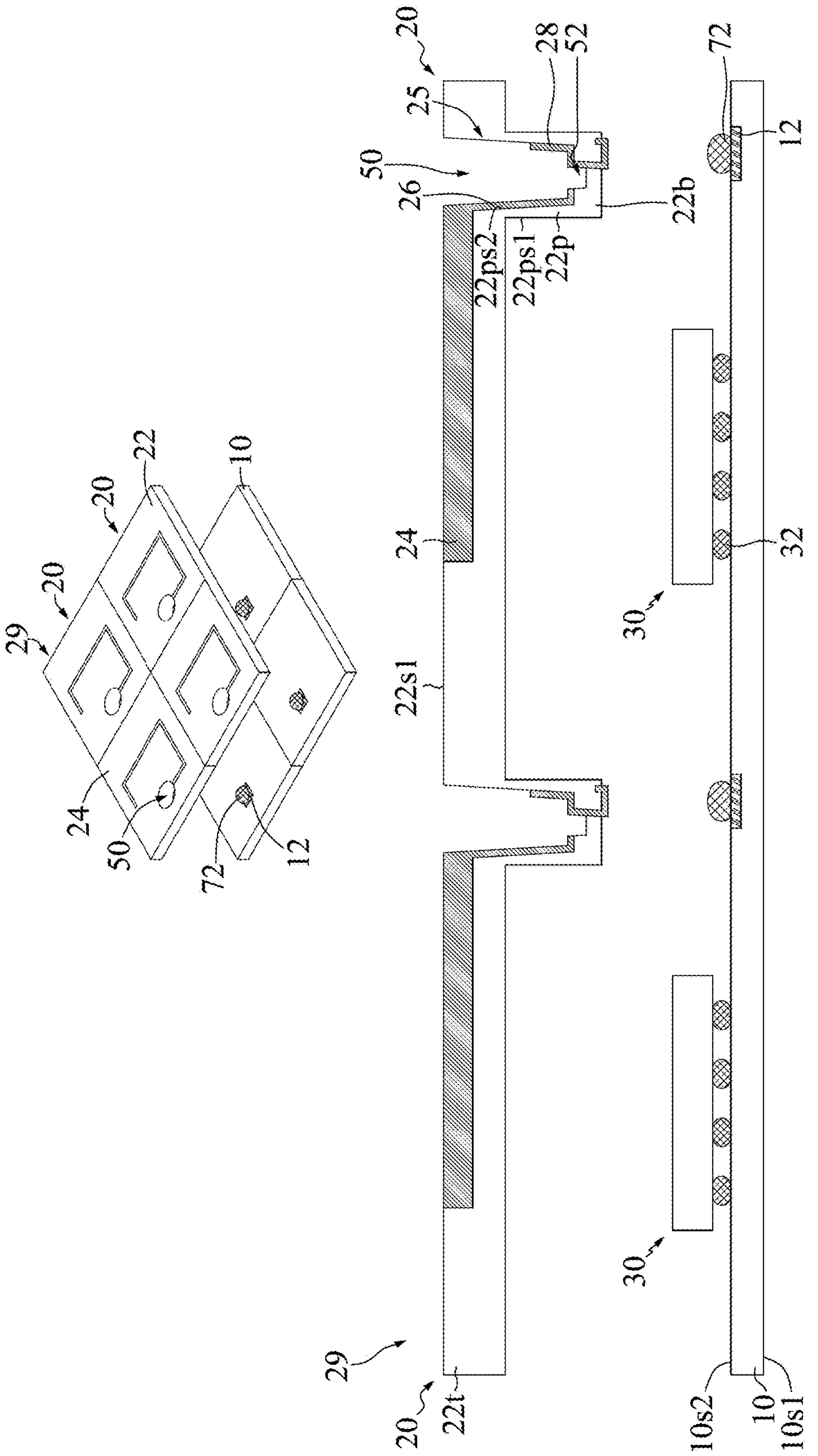
FIG. 7C illustrates one or more stages of an example of a method for manufacturing an electronic device according to some embodiments of the present disclosure.

Referring to FIG. 7C, FIG. 7 illustrates a perspective view and a cross-sectional view. An antenna integrated structure 29 may be provided. In some arrangements, the antenna integrated structure 29 may include a plurality of antenna components 20 (or antenna units) which may define an N×N array. Each of the antenna components 20 may include an antenna pattern 24 and a feeding structure 25. These antenna pattern 24 and feeding structure 25 are integrated within one dielectric structure 22 which defines a monolithic structure. As a result, the displacement and rotation offset may be reduced after the antenna integrated structure 29 is mounted on the carrier 10. In this stage, an alignment technique may be performed to align the antenna integrated structure 29 and the carrier 10. It should be noted that some components (e.g., electronic component 30) are omitted from the perspective view for brevity.

Figure 7D:
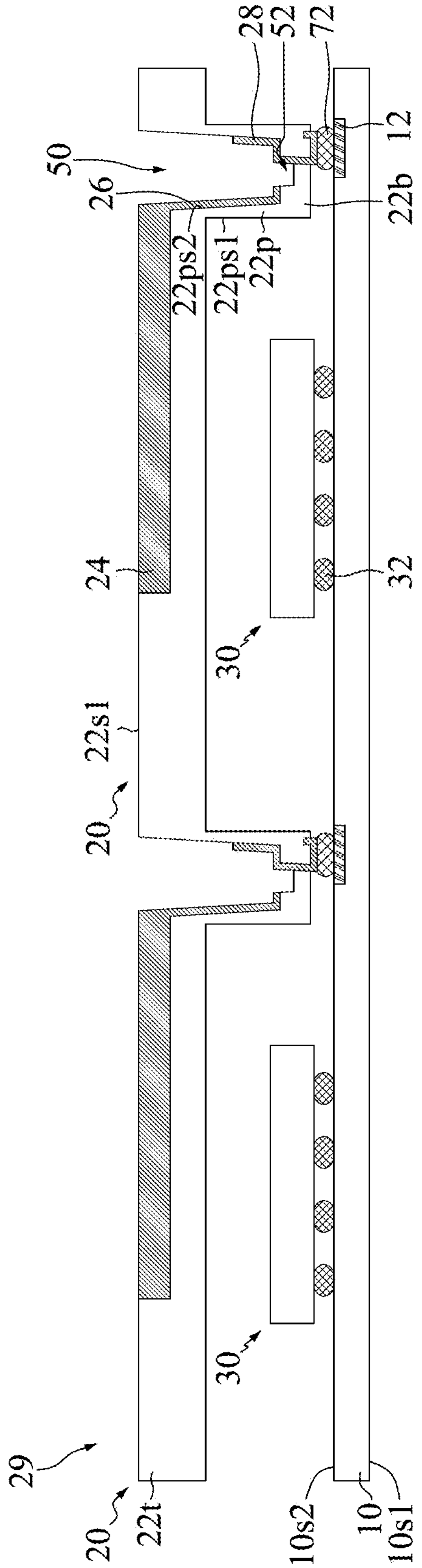
FIG. 7D illustrates one or more stages of an example of a method for manufacturing an electronic device according to some embodiments of the present disclosure.

Referring to FIG. 7D, the antenna integrated structure 29 may be attached to the surface 10*s*2 of the carrier 10 through the electrical connectors 72. Each of the antenna components 20 may be aligned with and then attached to a corresponding unit of the carrier 10.

Figure 7E:
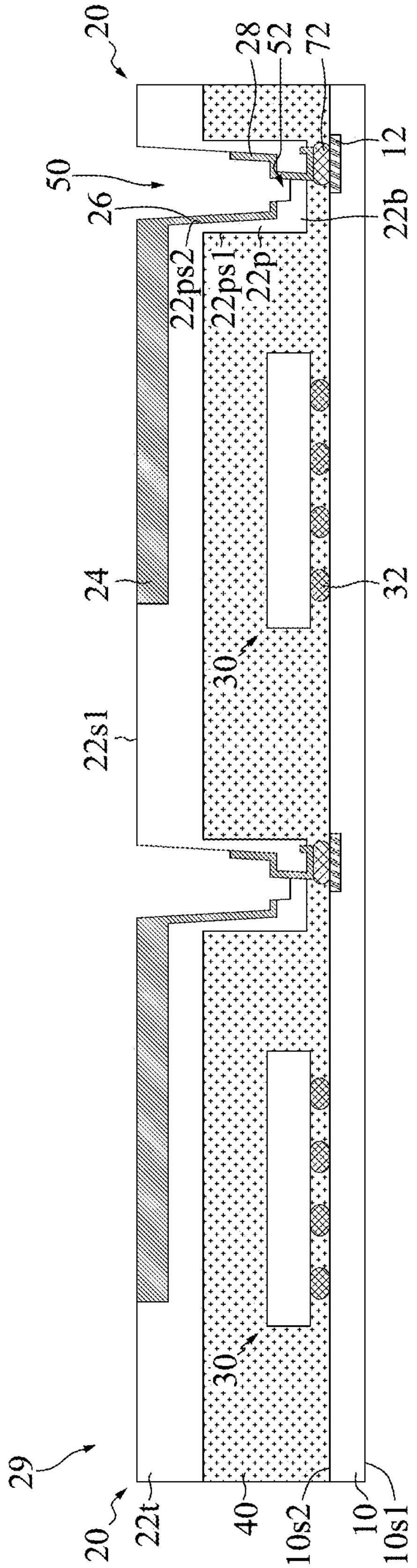
FIG. 7E illustrates one or more stages of an example of a method for manufacturing an electronic device according to some embodiments of the present disclosure.

Referring to FIG. 7E, the encapsulant 40 may be formed between the carrier 10 and the dielectric structure 22. The electronic component 30, the extension portion 22*p*, and the lower portion 22*b* of the dielectric structure 22 may be encapsulated.

Figure 7F:
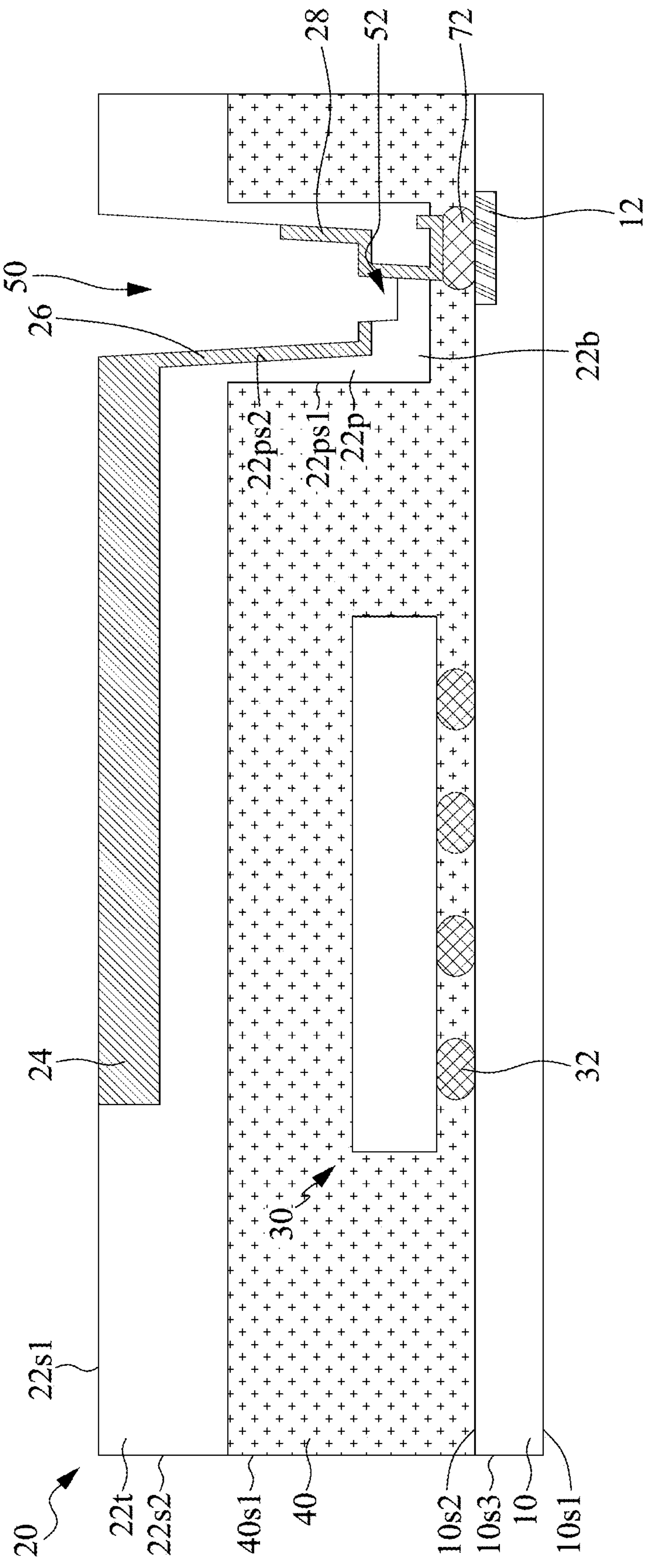
FIG. 7F illustrates one or more stages of an example of a method for manufacturing an electronic device according to some embodiments of the present disclosure.

Referring to FIG. 7F, a singulation technique may be performed. The carrier 10, dielectric structure 22, and the encapsulant 40 may be cut. As a result, the lateral surfaces of the carrier 10, dielectric structure 22, and encapsulant 40 may be substantially aligned with each other. The repeated units of the carrier 10 and multiple antenna pattern 24 may be separated.

Figure 7G:
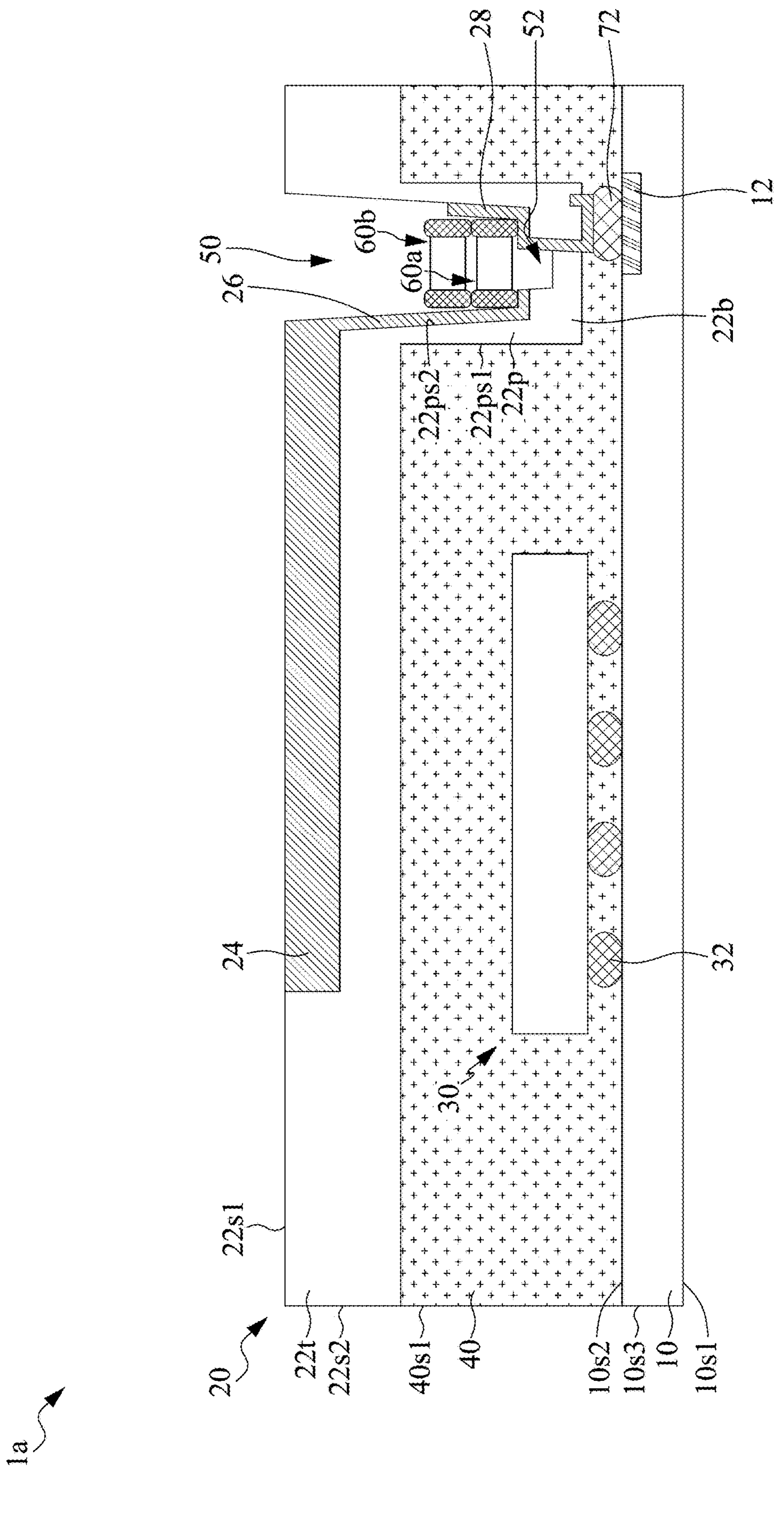
FIG. 7G illustrates one or more stages of an example of a method for manufacturing an electronic device according to some embodiments of the present disclosure.

Referring to FIG. 7G, the impedance matching components 60*a* and 60*b* may be disposed within the cavity 50. As a result, an electronic device (e.g., the electronic device 1*a* as shown in FIG. 1A to FIG. 1B) may be produced. In some arrangements, the electrical properties (e.g., the bandwidth, antenna gain, or the like) of the structure as shown in FIG. 7F may be measured. In some cases, if the electrical properties of the structure as shown in FIG. 7F are not as ideal as the simulation result are, the impedance matching components 60*a* and 60*b* may be used to regulate, adjust, modify, and/or control the electrical properties. In some arrangements, the impedance matching components 60*a* and 60*b* may be detachable. In some arrangements, one or more impedance matching components 60*a* and 60*b* may be used to adjust impedance finely. In some arrangements, the impedance matching components 60*a* and 60*b* may have different inductances, capacitances, or other electrical properties. In some arrangements, the impedance matching components 60*a* and 60*b* may have different dimensions (volume, height, width, length, or the like). As a result, the electrical properties may be finely tuned and reversible, which thereby improves and customizes the electrical properties (e.g., the bandwidth, antenna gain, or the like) of the electronic device 1*a*. In this arrangement, the profile and the location of the antenna pattern 24 and feeding structure 25 are predetermined and integrated within one dielectric structure 22. When the antenna integrated structure 29 is attached to the carrier 10, each feeding structure 25 may be aligned with a corresponding electrical connector 72 with less offset. In a comparative example, individual antenna units may be attached to a carrier using solder material, followed by a reflow technique to cure the solder. In this scenario, the antenna units may experience significant displacement and rotation offsets due to process issues.

Figure 8A:
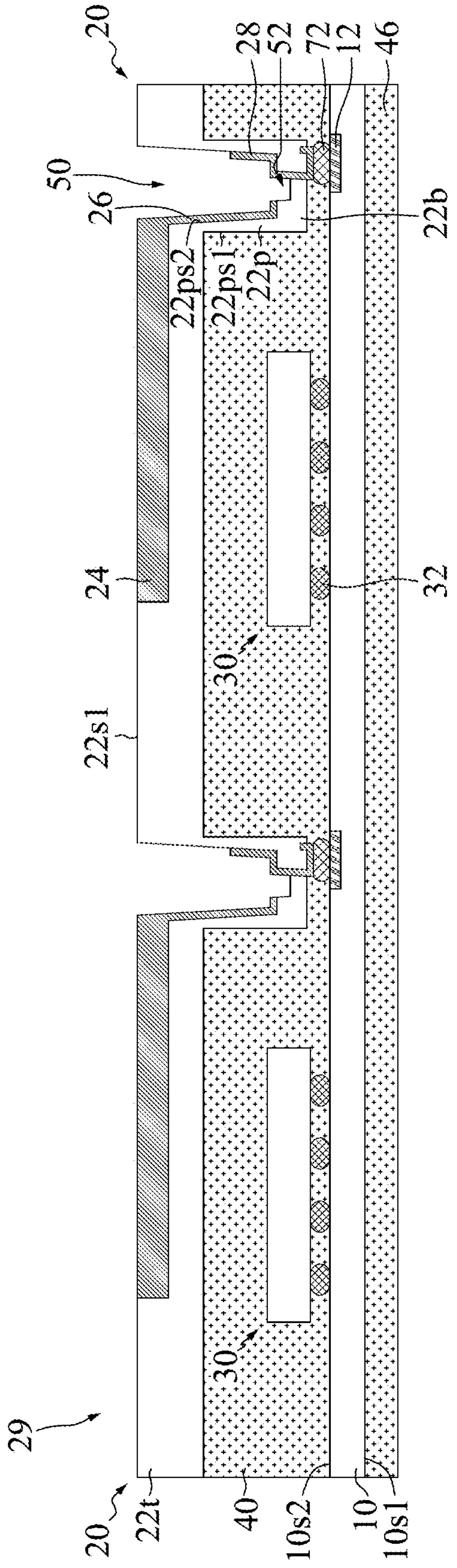
FIG. 8A illustrates one or more stages of an example of a method for manufacturing an electronic device according to some embodiments of the present disclosure.

FIGS. 8A to 8D illustrate various stages of an example of a method for manufacturing an electronic device according to some arrangements of the present disclosure. The stage as shown in FIG. 7D may be followed by the stage as shown in FIG. 8A.

Referring to FIG. 8A, in some arrangements, the antenna component 20 may be attached to a supporter (not shown) before forming the encapsulant 40. In some arrangements, the carrier 10 may be over-molded, and an encapsulant 46 may be formed to cover the surface 10*s*1 of the carrier 10.

Figure 8B:
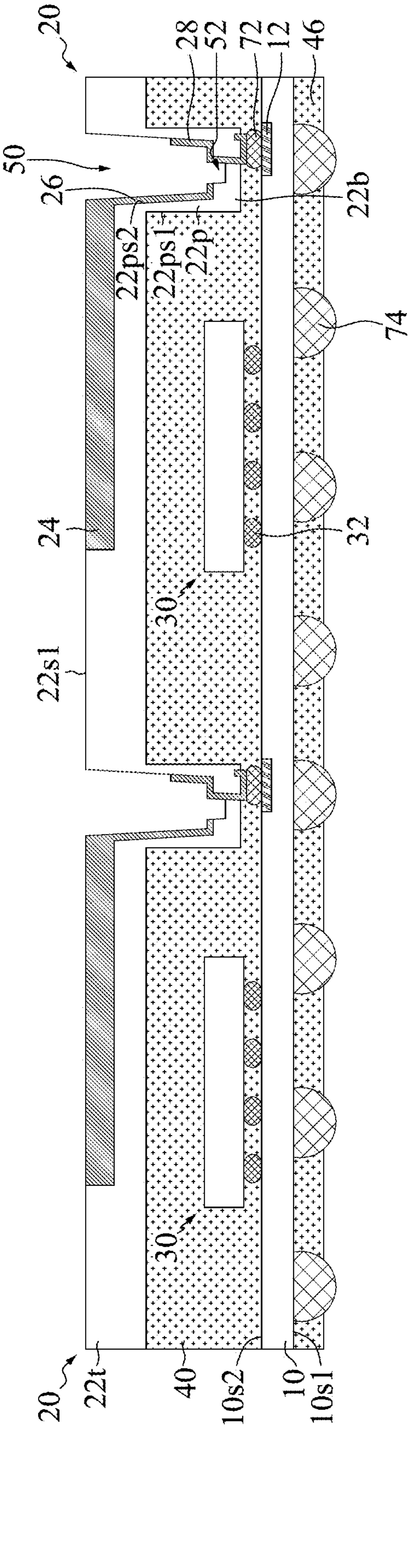
FIG. 8B illustrates one or more stages of an example of a method for manufacturing an electronic device according to some embodiments of the present disclosure.

Referring to FIG. 8B, electrical connectors 74 may be formed on or under the surface 10*s*1 of the carrier 10. In some arrangements, a portion of the encapsulant 46 may be removed, for example, by a laser ablation technique or other suitable techniques. Next, the electrical connectors 74 may be formed within the openings defined by the encapsulant 46. In some arrangements, the electrical connectors 74 may be formed, and the encapsulant 46 may be formed to encapsulate the electrical connectors 74. In some arrangements, the encapsulant 46 may be exposed by using an exposed mold chase. In some arrangements, the encapsulant 46 may be over-molded and then removed by a grinding technique or laser ablation technique to expose the electrical connectors 74.

Figure 8C:
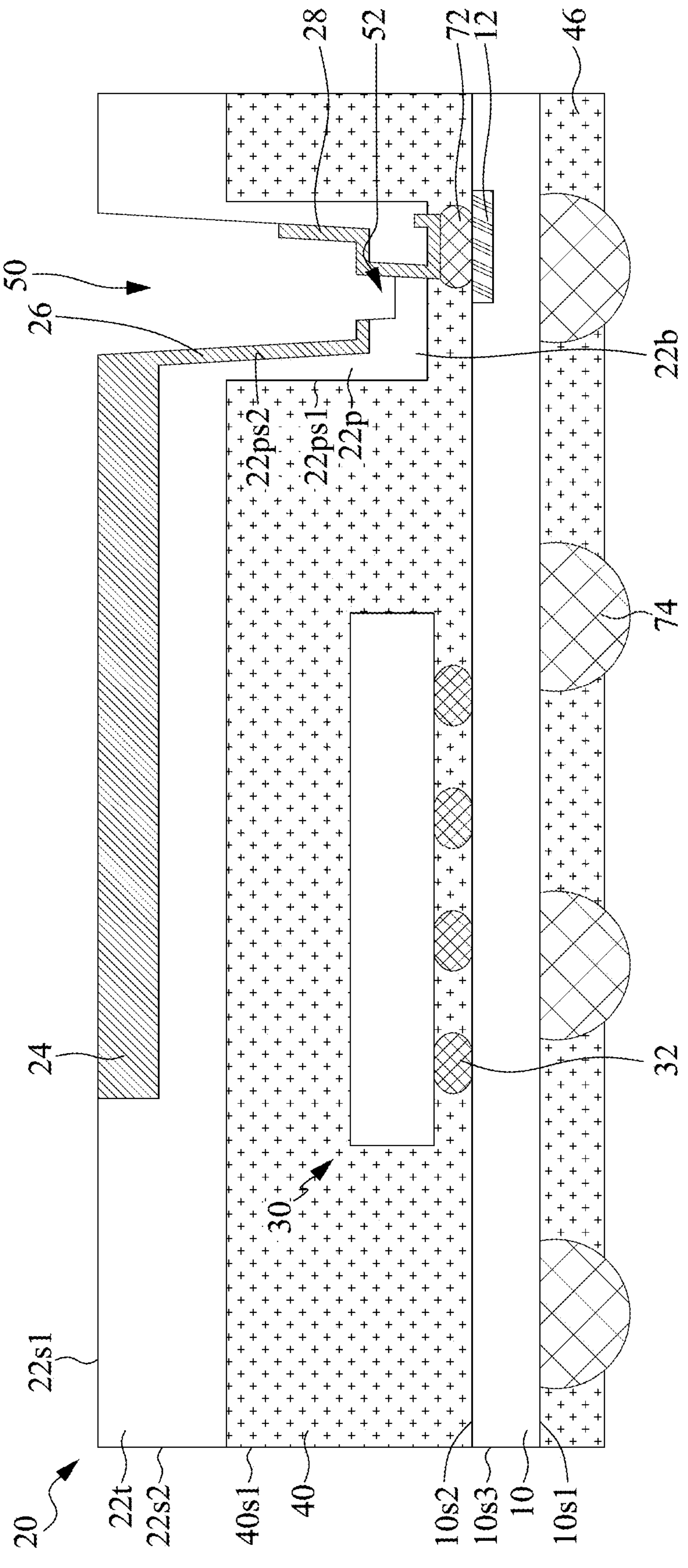
FIG. 8C illustrates one or more stages of an example of a method for manufacturing an electronic device according to some embodiments of the present disclosure.

Referring to FIG. 8C, a singulation technique may be performed. The carrier 10, dielectric structure 22, the encapsulant 40 and the encapsulant 46 may be cut. The repeated units of the carrier 10 and multiple antenna patterns 24 may be separated.

Figure 8D:
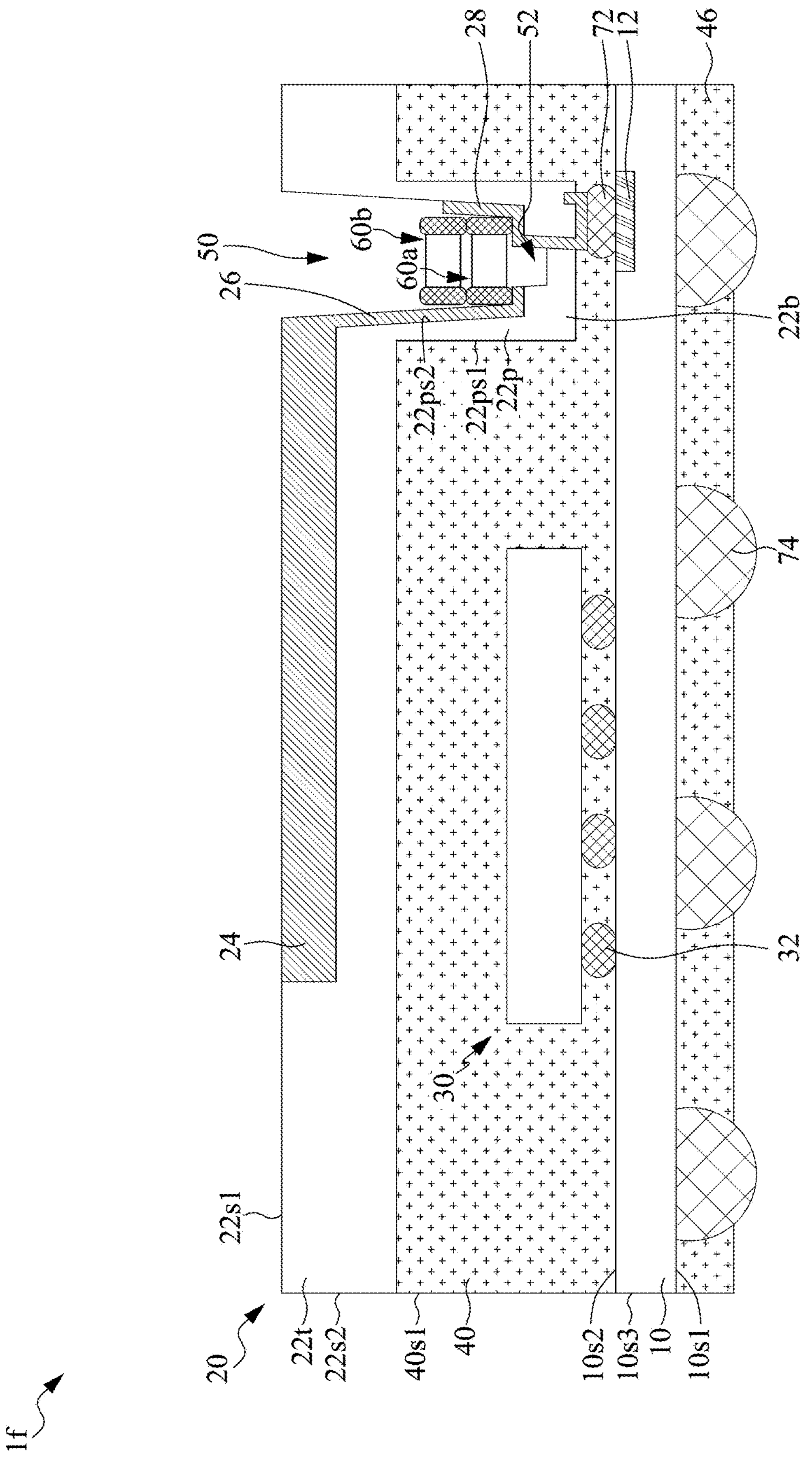
FIG. 8D illustrates one or more stages of an example of a method for manufacturing an electronic device according to some embodiments of the present disclosure.

Referring to FIG. 8D, the impedance matching components 60*a* and 60*b* may be disposed within the cavity 50. As a result, an electronic device 1*f* may be produced.

FIGS. 9A to 9G illustrate various stages of an example of a method for manufacturing an electronic device according to some arrangements of the present disclosure.

Figure 9A:
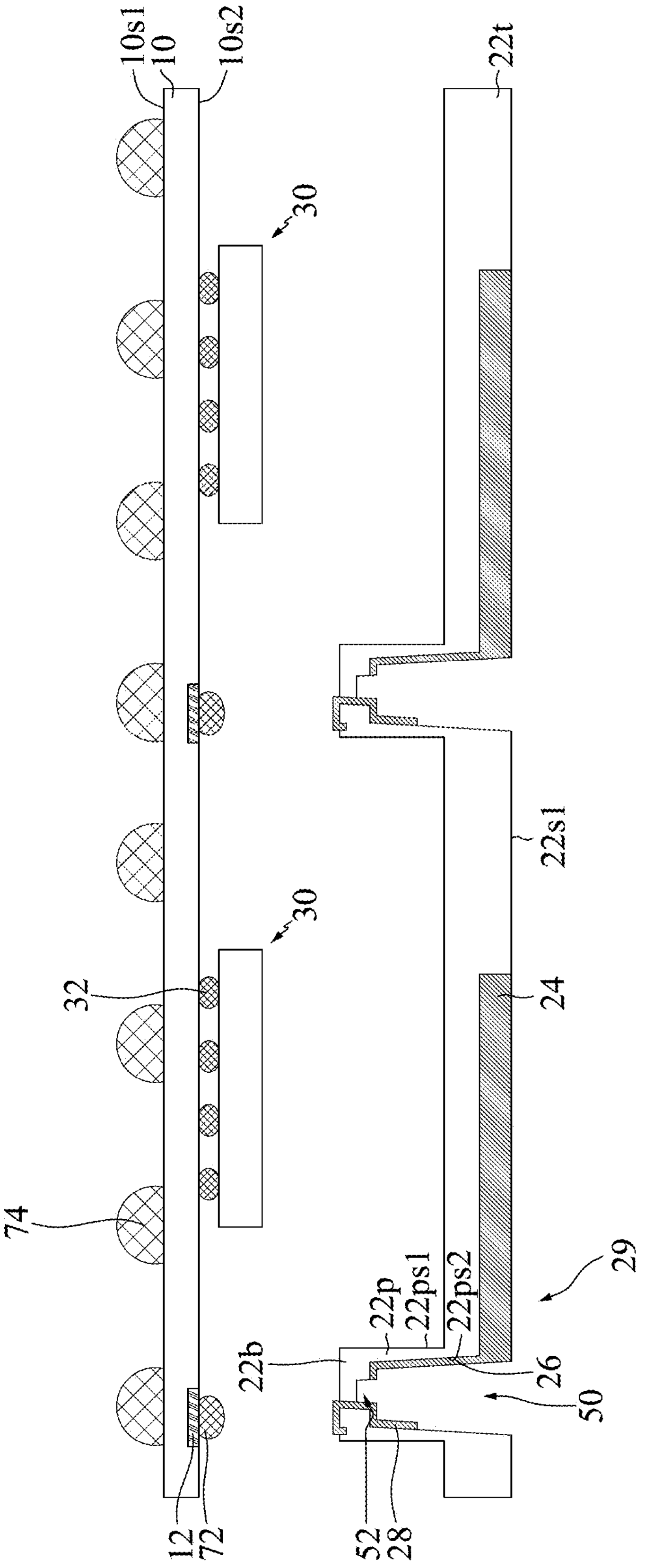
FIG. 9A illustrates one or more stages of an example of a method for manufacturing an electronic device according to some embodiments of the present disclosure.

Referring to FIG. 9A, the antenna integrated structure 29 may be provided and function as a supporter. The carrier 10 may be provided. The electrical connectors 74 may be formed on the surface 10*s*1 of the carrier 10.

Figure 9B:
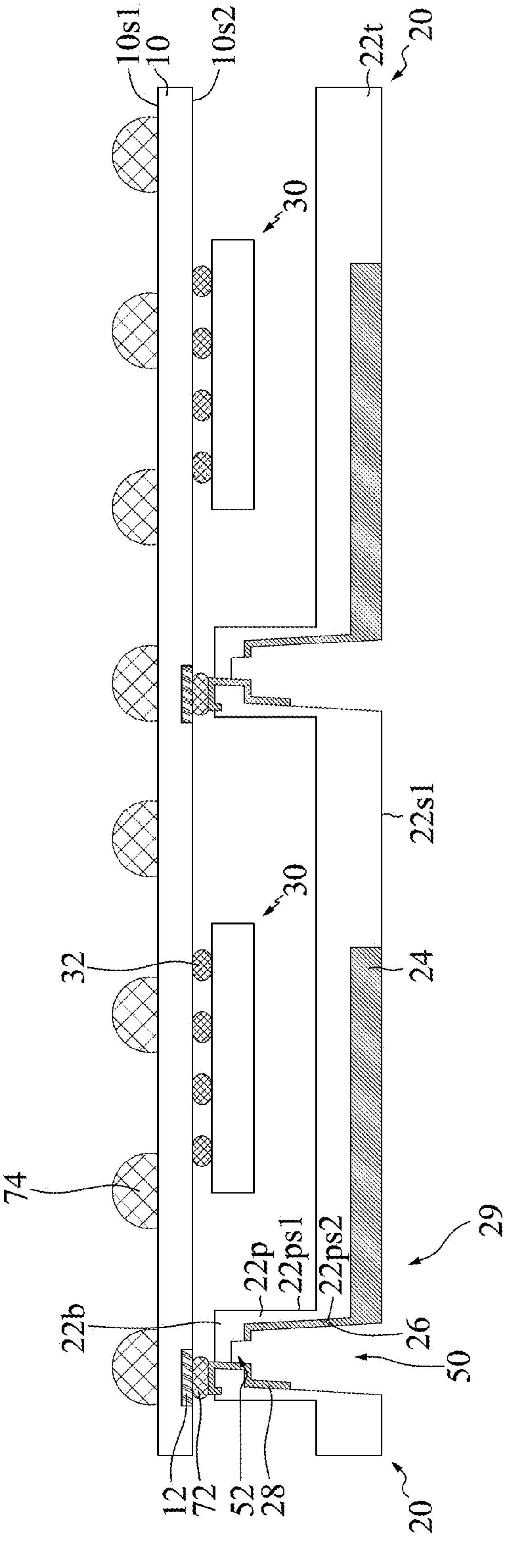
FIG. 9B illustrates one or more stages of an example of a method for manufacturing an electronic device according to some embodiments of the present disclosure.

Referring to FIG. 9B, the antenna integrated structure 29 may be attached to the carrier 10.

Figure 9C:
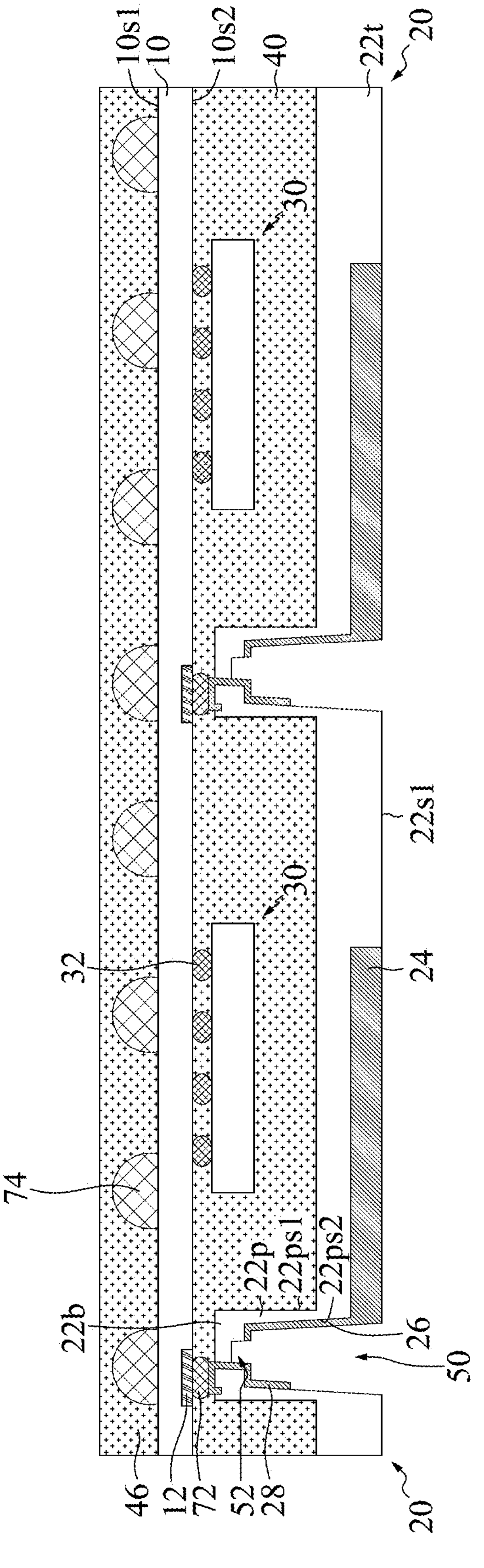
FIG. 9C illustrates one or more stages of an example of a method for manufacturing an electronic device according to some embodiments of the present disclosure.

Referring to FIG. 9C, the encapsulant 40 and encapsulant 46 may be formed. In some arrangements, the encapsulant 40 and encapsulant 46 may be formed by one step.

Figure 9D:
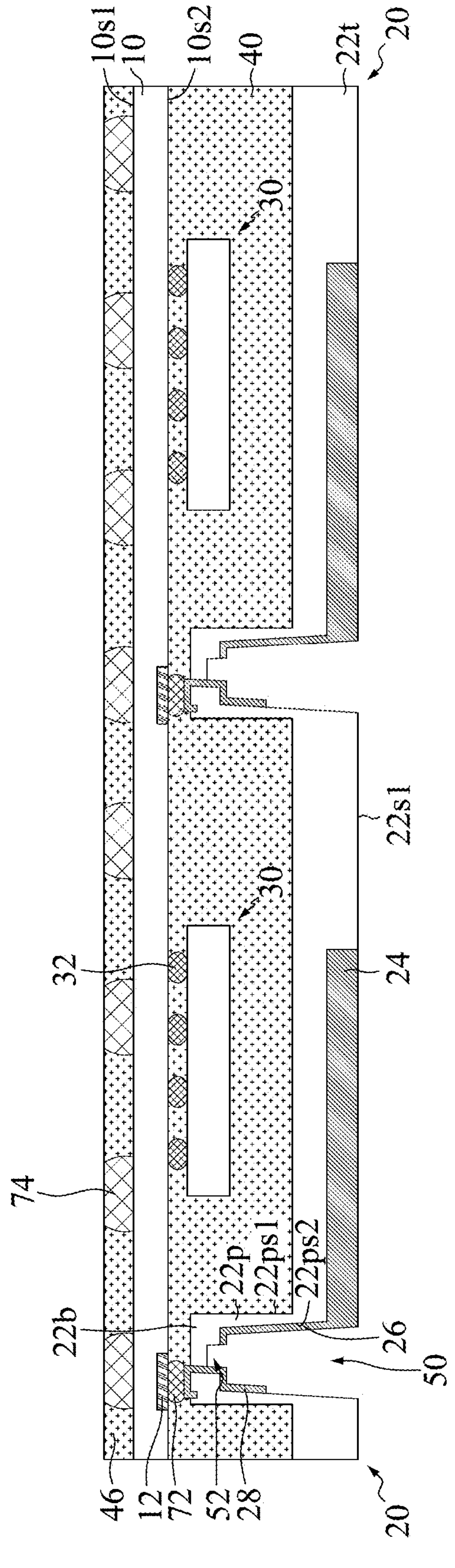
FIG. 9D illustrates one or more stages of an example of a method for manufacturing an electronic device according to some embodiments of the present disclosure.

Referring to FIG. 9D, a grinding or polishing technique may be performed on the encapsulant 46. As a result, the top of the encapsulant 46 and the top of the electrical connectors 74 may be substantially aligned.

Figure 9E:
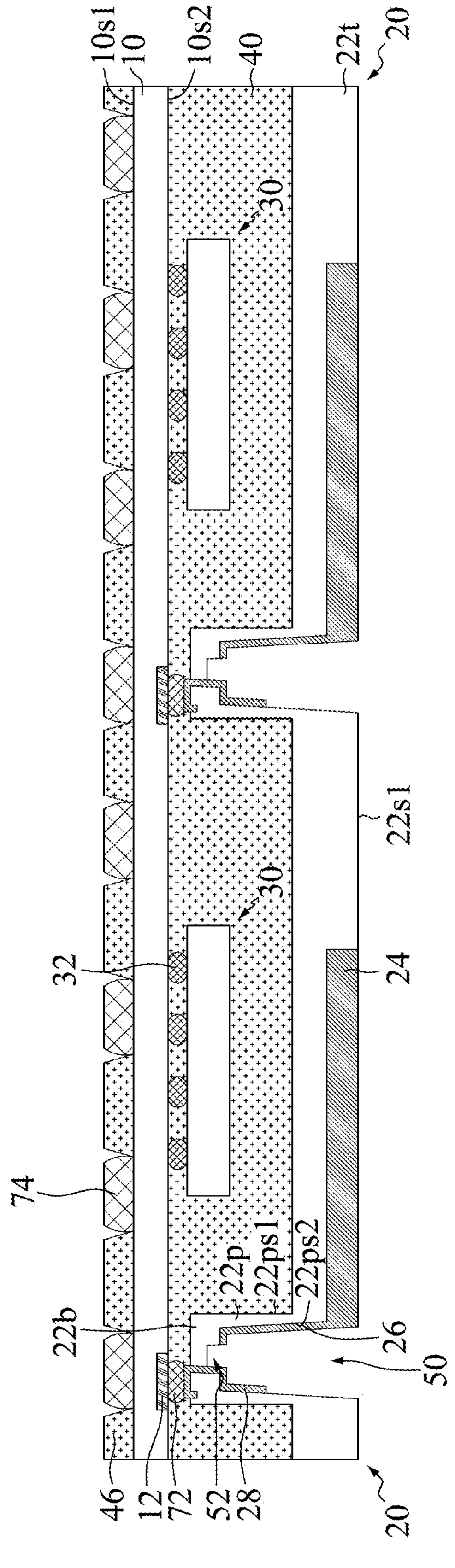
FIG. 9E illustrates one or more stages of an example of a method for manufacturing an electronic device according to some embodiments of the present disclosure.

Referring to FIG. 9E, a portion of the encapsulant 46 may be removed, for example, by a laser ablation technique or other suitable techniques. As a result, the top of the encapsulant 46 may be disconnected from the top of the electrical connector electrical connector 14.

Figure 9F:
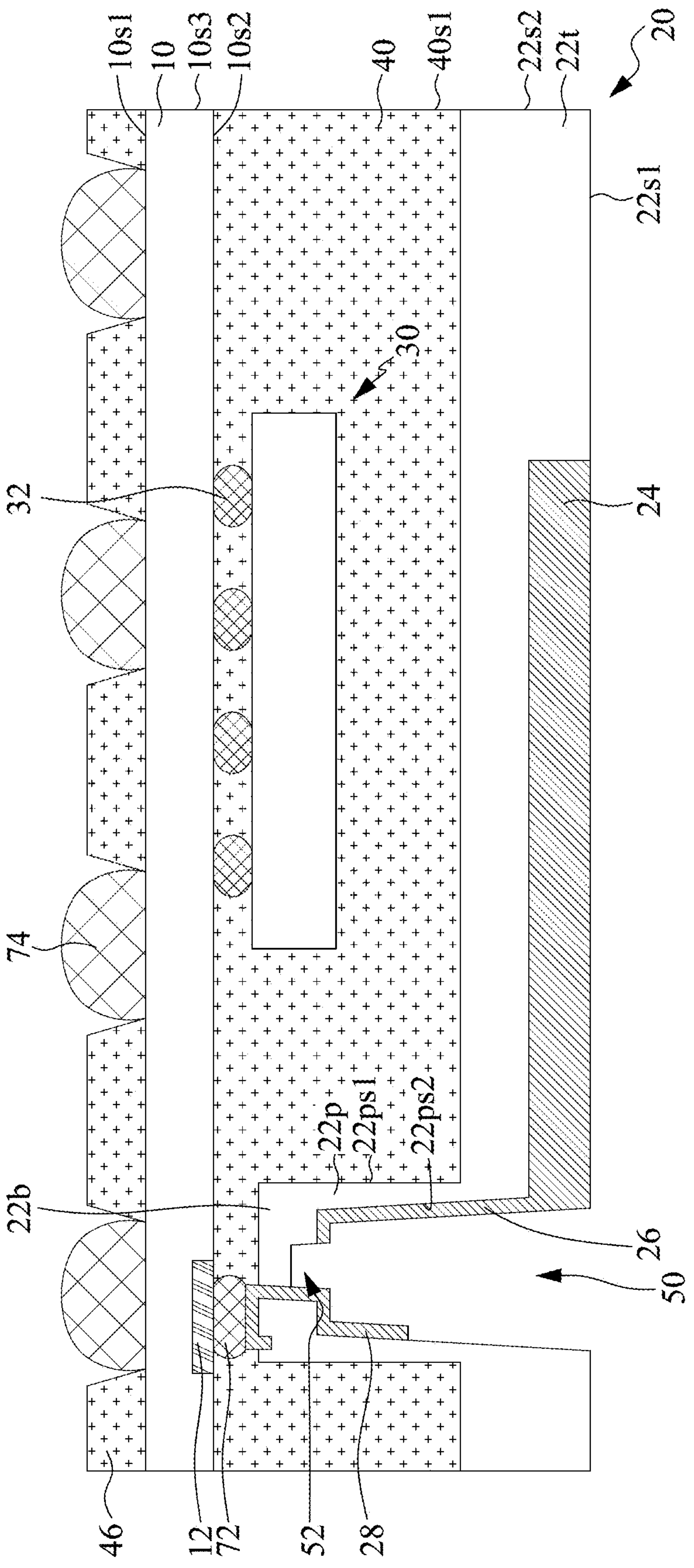
FIG. 9F illustrates one or more stages of an example of a method for manufacturing an electronic device according to some embodiments of the present disclosure.

Referring to FIG. 9F, a reflow technique may be performed. In this stage, reflow materials may be utilized to reshape the electrical connectors 74. Next, a singulation technique may be performed. The carrier 10, dielectric structure 22, the encapsulant 40 and the encapsulant 46 may be cut. The repeated units of the carrier 10 and multiple antenna pattern 24 may be separated.

Figure 9G:
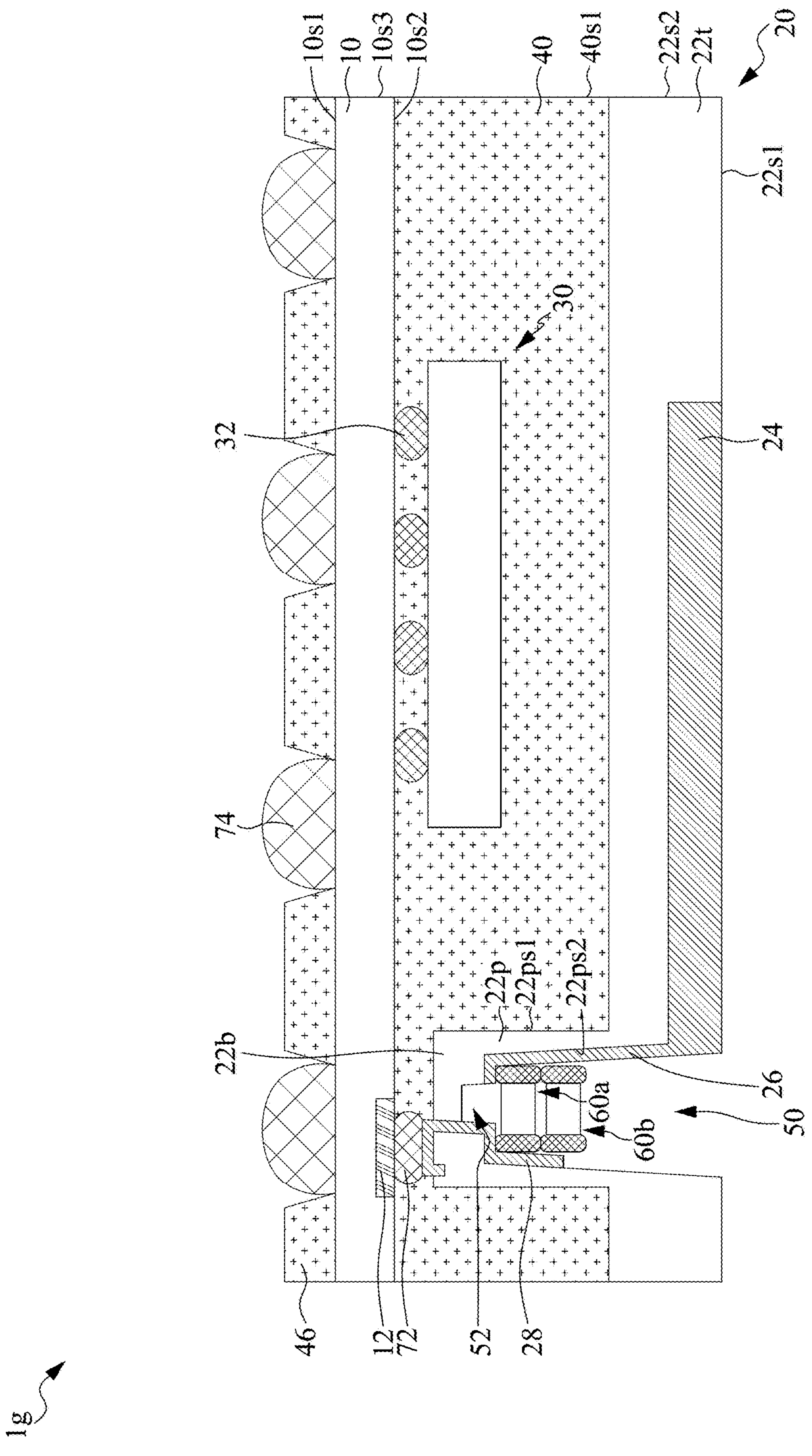
FIG. 9G illustrates one or more stages of an example of a method for manufacturing an electronic device according to some embodiments of the present disclosure.

Referring to FIG. 9G, the impedance matching components 60*a* and 60*b* may be disposed within the cavity 50. As a result, an electronic device 1*g* may be produced.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:

an electronic component;

an antenna component disposed over the electronic component, wherein the antenna component comprises:

a dielectric structure having a top surface defining a cavity recessed from the top surface of the dielectric structure, an antenna pattern contacting the top surface of the dielectric structure, and a feeding structure contacting a sidewall of the cavity defined by the dielectric structure, wherein a portion of the sidewall of the dielectric structure is not covered by the feeding structure; and an impedance matching component disposed on the feeding structure and fully surrounded by the sidewall of the dielectric structure.

2. The electronic device of claim 1, wherein the feeding structure comprises a first conductive layer connected to the antenna pattern, and the first conductive layer is disposed on the sidewall of the dielectric structure.

3. The electronic device of claim 2, wherein the feeding structure comprises a second conductive layer spaced apart from the first conductive layer, and the impedance matching component electrically connects the first conductive layer to the second conductive layer.

4. The electronic device of claim 3, wherein the second conductive layer is disposed on the sidewall of the dielectric structure.

5. The electronic device of claim 1, wherein the impedance matching component comprises at least one passive component.

6. The electronic device of claim 1, wherein the impedance matching component comprises a first capacitor and a second capacitor vertically stacked over the first capacitor, and the sidewall of the dielectric structure laterally surrounds the first capacitor and the second capacitor.

7. The electronic device of claim 1, further comprising:

a carrier supporting the feeding structure of the antenna component and electrically connects the electronic component to the antenna pattern.

8. The electronic device of claim 1, wherein the cavity penetrates the dielectric structure.

9. The electronic device of claim 1, wherein the dielectric structure comprises a base portion exposed by the cavity and configured to support the impedance matching component.

10. The electronic device of claim 1, further comprising:

a protection layer covering the impedance matching component.

11. An electronic device, comprising:

a carrier;

an antenna component disposed over the carrier, wherein the antenna component comprises a dielectric structure defining a first cavity and a second cavity over the first cavity, wherein a width of the first cavity is less than a width of the second cavity; and an impedance matching component disposed over the carrier and within the second cavity and over the first cavity, wherein the antenna component further comprises a feeding structure, comprising:

a first conductive layer connected to a first terminal of the impedance matching component and contacting a sidewall of the second cavity without contacting a sidewall of the first cavity; and a second conductive layer connected to a second terminal of the impedance matching component and contacting the sidewall of the first cavity and the sidewall of the second cavity.

12. The electronic device of claim 11, wherein the antenna component comprises an antenna pattern disposed on the dielectric structure, and the dielectric structure defines a base portion supporting the impedance matching component and the feeding structure.

13. The electronic device of claim 12, wherein the first conductive layer extends between the antenna pattern and the base portion of the dielectric structure.

14. The electronic device of claim 13, further comprising:
an electronic component over the carrier;
wherein the second conductive layer penetrates the base portion of the dielectric structure and is configured to receive the signal from the electronic component.

15. The electronic device of claim 14, wherein a portion of the first conductive layer is free from laterally overlapping the second conductive layer.

16. An electronic device, comprising:
a carrier; and
an encapsulant over the carrier and defining a first cavity;
an antenna component disposed over the encapsulant, wherein the antenna component comprises:
a dielectric structure partially within the first cavity and defining a second cavity surrounded by the first cavity;
an antenna pattern over the dielectric structure; and
a feeding structure contacting a sidewall of the second cavity and spaced apart from a sidewall of the first cavity, wherein a slope of the sidewall of the first cavity is greater than a slope of the sidewall of the second cavity.

17. The electronic device of claim 16, further comprising:
an impedance matching component disposed within the second cavity and configured to electrically connect the antenna pattern and the carrier.

18. The electronic device of claim 17, wherein the impedance matching component is fully surrounded by the sidewall of the second cavity, and a portion of the sidewall of the second cavity is not covered by the feeding structure.

19. The electronic device of claim 18, wherein the dielectric structure further defines a third cavity in communication with the second cavity, and wherein a width of the second cavity is different from a width of the third cavity.

* * * * *